United States Patent
Yorita

(10) Patent No.: US 9,252,781 B2
(45) Date of Patent: *Feb. 2, 2016

(54) OSCILLATOR

(71) Applicant: NIHON DEMPA KOGYO CO., LTD., Tokyo (JP)

(72) Inventor: Tomoya Yorita, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 16 days.

This patent is subject to a terminal disclaimer.

(21) Appl. No.: 14/341,836

(22) Filed: Jul. 27, 2014

(65) Prior Publication Data

US 2015/0028960 A1    Jan. 29, 2015

(30) Foreign Application Priority Data

Jul. 29, 2013    (JP) .................................. 2013-156901

(51) Int. Cl.
    *H03L 1/02*    (2006.01)
(52) U.S. Cl.
    CPC ...................... *H03L 1/026* (2013.01)
(58) Field of Classification Search
    CPC ........................................................ H03L 1/02
    USPC .......... 331/116 R, 116 FE, 158, 176, 46, 175, 331/177 R
    See application file for complete search history.

(56) References Cited

U.S. PATENT DOCUMENTS 5,574,408 A * 11/1996 Zwack .......................... 331/176
2013/0293312 A1* 11/2013 Yorita .............................. 331/70

FOREIGN PATENT DOCUMENTS

| JP | 2001-292030 | 10/2001 |
| JP | 2013-051676 | 3/2013 |
| JP | 2013-051677 | 3/2013 |
| JP | 2013-143601 | 7/2013 |
| JP | 2013-232836 | 11/2013 |

* cited by examiner

*Primary Examiner* — Jeffrey Shin
(74) *Attorney, Agent, or Firm* — Jianq Chyun IP Office

(57) ABSTRACT

An oscillator uses a differential signal corresponding to a difference between an oscillation output f1 of a first oscillator circuit and an oscillation output f2 of a second oscillator circuit as a temperature detection value, and outputs a control signal for reducing an influence caused by a temperature characteristic of the oscillation output f1 based on the differential signal. The oscillator includes a switching unit configured to alternately switch between a first state where a first connecting terminal and a second connecting terminal are connected to a storage unit for access of an external computer to the storage unit, and a second state where the first connecting terminal and the second connecting terminal are respectively connected to a first signal path and a second signal path via a frequency reduction unit such that the output signals from the frequency reduction unit are extracted to an external frequency measuring unit.

10 Claims, 18 Drawing Sheets

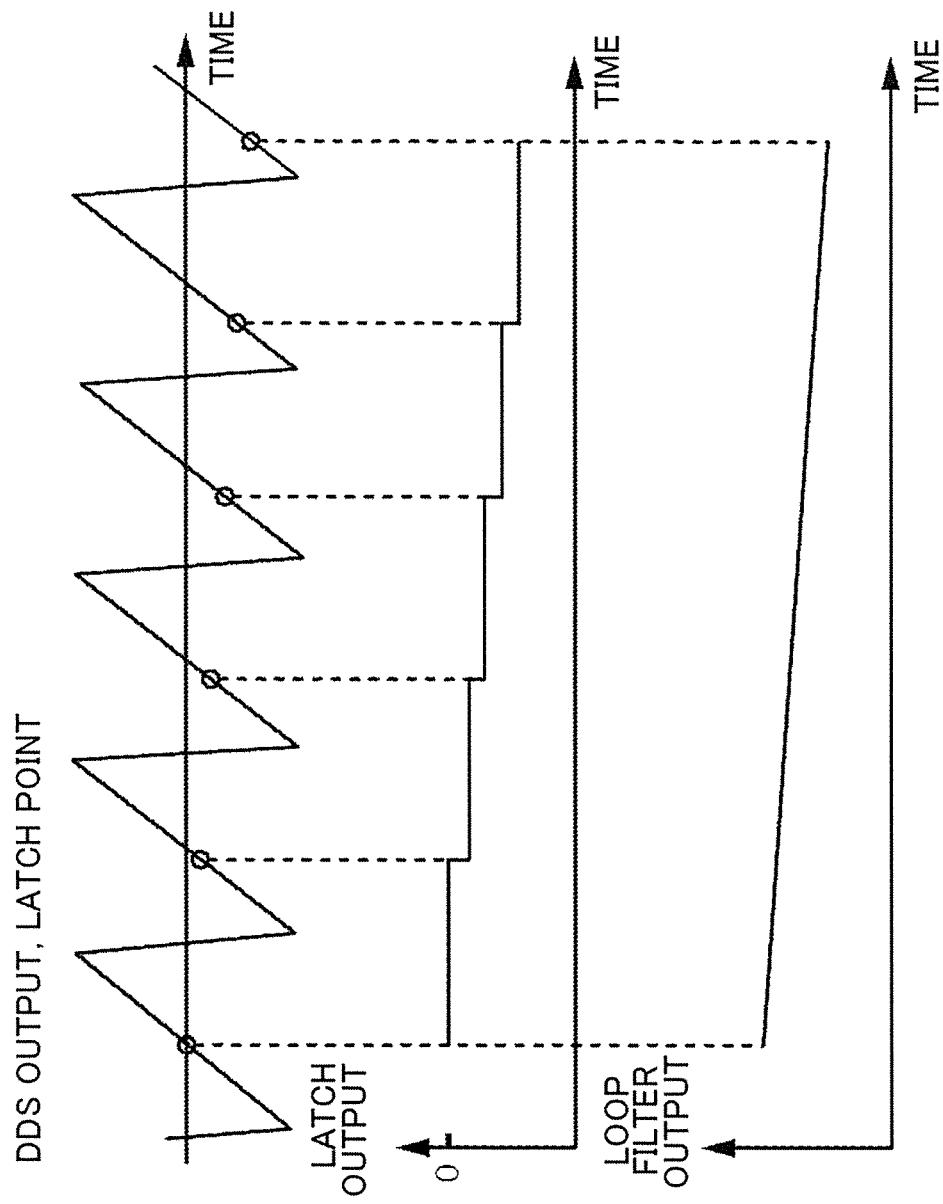

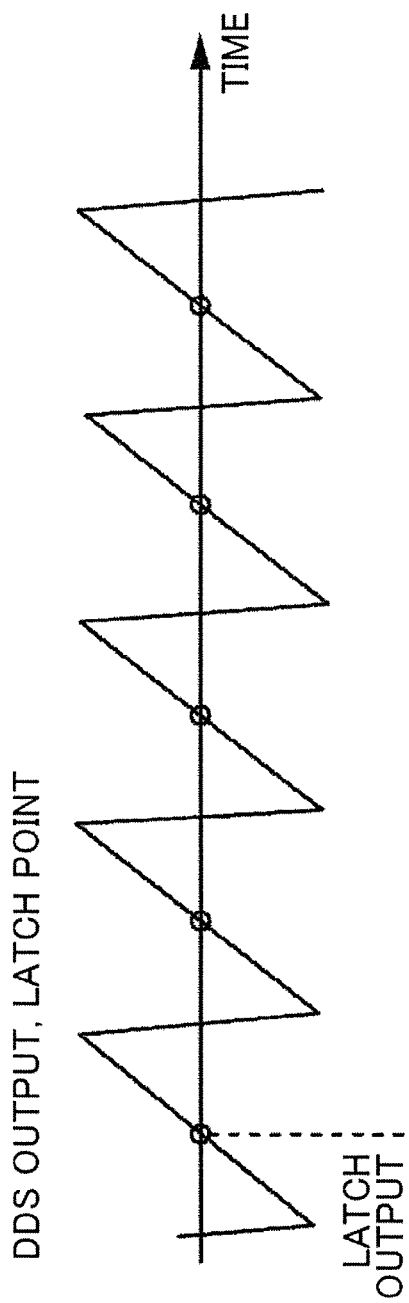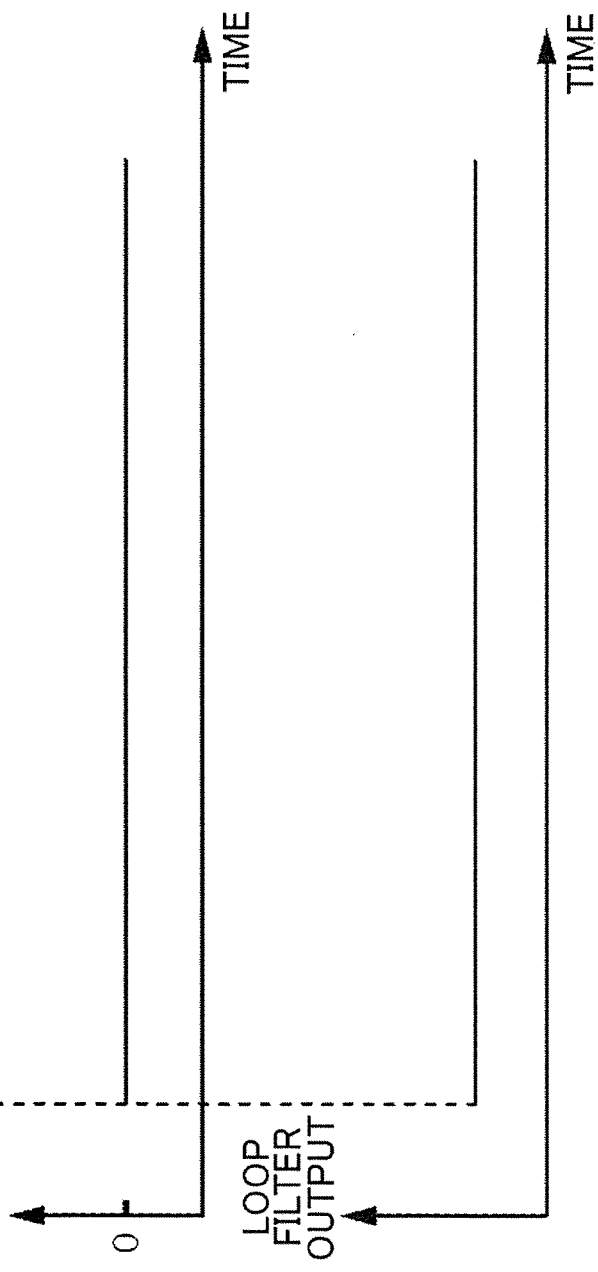

OSCILLATOR

CROSS-REFERENCE TO RELATED APPLICATION

This application claims the priority benefit of Japanese application serial no. 2013-156901, filed on Jul. 29, 2013. The entirety of the above-mentioned patent application is hereby incorporated by reference herein and made a part of this specification.

BACKGROUND

1. Technical Field

This disclosure relates to an oscillator that uses, as a temperature detection value, a signal corresponding to a difference between an oscillation output f1 of a first oscillator circuit and an oscillation output f2 of a second oscillator circuit, and reduces an influence caused by temperature characteristics of the oscillation output f1.

2. Description of the Related Art

FIG. 18 illustrates a general constitution of a Temperature Compensated Crystal Oscillator (TCXO), which is an oscillator. Reference numeral 90 denotes a crystal unit, and reference numeral 91 denotes an oscillator circuit. Changing a control voltage, which is supplied from a control voltage generator 93 to a voltage variable capacitance element 92, controls capacitance of the voltage variable capacitance element 92 to adjust an oscillation frequency (output frequency).

Since the frequency of the crystal unit 90 changes depending on the temperature, the control voltage generator 93 corrects a control voltage in response to temperatures detected by a temperature sensor 94. In general, a cubic function is stored in a memory 95 for example, then a frequency corresponding to a temperature detection value is read out based on the cubic function (frequency versus temperature characteristic), which is a function to normalize frequency versus temperature characteristics of the crystal unit 90 using a reference temperature. That is, a difference between a frequency at a temperature at that moment and a frequency at the reference temperature is read out. A control voltage that corresponds to the difference between the frequencies is set as a temperature compensation amount. Then, the temperature compensation amount is subtracted from a control voltage that corresponds to the frequency at the reference temperature. Besides an example described above, another oscillator that can output more precise signal is offered. This oscillator uses, as a temperature detection value, a signal corresponding to a difference between an oscillation output f1 of a first oscillator circuit and an oscillation output f2 of a second oscillator circuit to achieve such a precise output. The details thereof will be described in this embodiment.

Incidentally, an oscillator should be adjusted in order to achieve a stable oscillation output. In the example of the TCXO, a function is set, which function determines a control voltage corresponding to the above-described temperature detection value. It is, however, required to make an oscillator connectable to, for example, a device that measures a frequency for adjustment in order to perform such an adjustment without complicating a configuration of an oscillator.

FIGS. 2 and 3 in Japanese Unexamined Patent Application Publication No. 2001-292030 (hereinafter referred to as Patent Literature 1) illustrates a configuration of two crystal units (crystal resonators) sharing a common crystal element on which two pairs of electrodes are disposed. According to the paragraph 0018 in the Patent Literature 1, a frequency difference between the two crystal units is caused by temperature change, accordingly the temperature can be measured by measuring this frequency difference. A relation between this frequency difference $\Delta f$ and a frequency amount to be corrected is stored in a ROM, and the frequency correction amount is read out based on the frequency difference $\Delta f$. This apparatus, however, cannot solve the above-described problem.

This disclosure has been made in view of these circumstances, and an object of the disclosure is to provide an oscillator that can reduce an influence caused by temperature characteristics at high accuracy with simplifying the configuration of the oscillator.

SUMMARY

An oscillator according to the disclosure uses a differential signal corresponding to a difference between an oscillation output f1 of a first oscillator circuit and an oscillation output f2 of a second oscillator circuit as a temperature detection value, and outputs a control signal for reducing an influence caused by a temperature characteristic of the oscillation output f1 based on the differential signal. The oscillator includes a storage unit, a signal processing unit, a first connecting terminal and a second connecting terminal for connecting to an external computer, a frequency reduction unit, and a switching unit. The storage unit stores a parameter for outputting the control signal. The signal processing unit is connected to a first signal path and a second signal path for respectively extracting the signals f1 and f2. The signal processing unit is configured to obtain the differential signal from the extracted signals f1 and f2, and output the control signal based on the differential signal and the parameter. The frequency reduction unit is connected to the first oscillator circuit and the second oscillator circuit. The frequency reduction unit is configured to output signals having frequencies that respectively correspond to the frequencies of the signals f1 and f2 and are lower than the frequencies of the signals f1 and f2. The switching unit is configured to alternately switch between a first state and a second state. The first state is a state where the first connecting terminal and the second connecting terminal are connected to the storage unit for access of the external computer to the storage unit. The second state is a state where the first connecting terminal and the second connecting terminal are respectively connected to the first signal path and the second signal path via the frequency reduction unit such that the output signals from the frequency reduction unit are extracted to an external frequency measuring unit.

The oscillator may include the following features.

(1) The frequency reduction unit is a frequency divider, and the output signals having frequencies respectively corresponding to the frequencies of the signals f1 and f2 and are lower than the frequencies of the signals f1 and f2 are respectively obtained by frequency-dividing the signals f1 and f2.

(2) The switching unit switches between the first state and the second state based on a logical value stored in a storage region for switching of connection state provided in the storage unit. The storage region for switching stores a logical value selected from a first logical value and a second logical value, the first logical value being a value for driving the switching unit to the first state, the second logical value being a value for driving the switching unit to the second state. The oscillator further comprises a reset unit configured to reset the logical value in the storage region for switching to the first logical value, the reset unit being provided independently of the external computer.

(3) The reset unit resets a logical value storage region to the first logical value when a power source of the oscillator is turned on.

(4) A control signal for reducing an influence caused by a temperature characteristic of the signal f1 is a signal corresponding to a frequency correction value relative to the signal f1 at a reference temperature, the control signal being based on a relation between a variation amount from a value of the signal f1 at the reference temperature of the signal f1 and a signal corresponding to a difference between the signals f1 and f2.

(5) The oscillator further includes a heat regulating unit configured to maintain a constant temperature of a first crystal unit and a second crystal unit, the first crystal unit and the second crystal unit being respectively connected to the first oscillator circuit and the second oscillator circuit. A control signal for reducing an influence caused by a temperature characteristic of the signal f1 is a signal for controlling an amount of heat generated by the heat regulating unit.

The oscillator of this disclosure is configured to output a control signal for reducing an influence caused by the temperature characteristics of the oscillation output f1 based on a differential signal corresponding to a difference between the oscillation output f1 of the first oscillator circuit and the oscillation output f2 of the second oscillator circuit. Then, the oscillator alternately switches a first connecting terminal and a second connecting terminal, which are connected to an external computer, to connect a storage unit for storing parameters used by the signal processing unit for outputting the control signal, or to connect to a signal path via a frequency reduction unit that decreases frequencies of the oscillation outputs f1 and f2, the signal path supplying the oscillation outputs f1 and f2 to the signal processing unit. The oscillation outputs f1 and f2 can be obtained based on an association between the oscillation outputs f1 and f2, and output frequencies from the first connecting terminal and the second connecting terminal, and output frequencies from the first connecting terminal and the second connecting terminal. Various parameters can be set such that frequency variation due to temperature change can be reduced with high accuracy from the obtained oscillation outputs f1 and f2. Further, this oscillator is not required to provide terminals only for extracting the oscillation outputs f1 and f2, accordingly the configuration of the oscillator can be simplified.

BRIEF DESCRIPTION OF THE DRAWINGS

FIGS. 4A through 4C are waveform diagrams of each portion schematically illustrating a state where a loop including a DDS circuit unit shown in FIG. 2 is unlocked.

FIGS. 5A through 5C are waveform diagrams of each portion schematically illustrating a state where a loop including a DDS circuit unit shown in FIG. 2 is locked.

DETAILED DESCRIPTION

Figure 1:
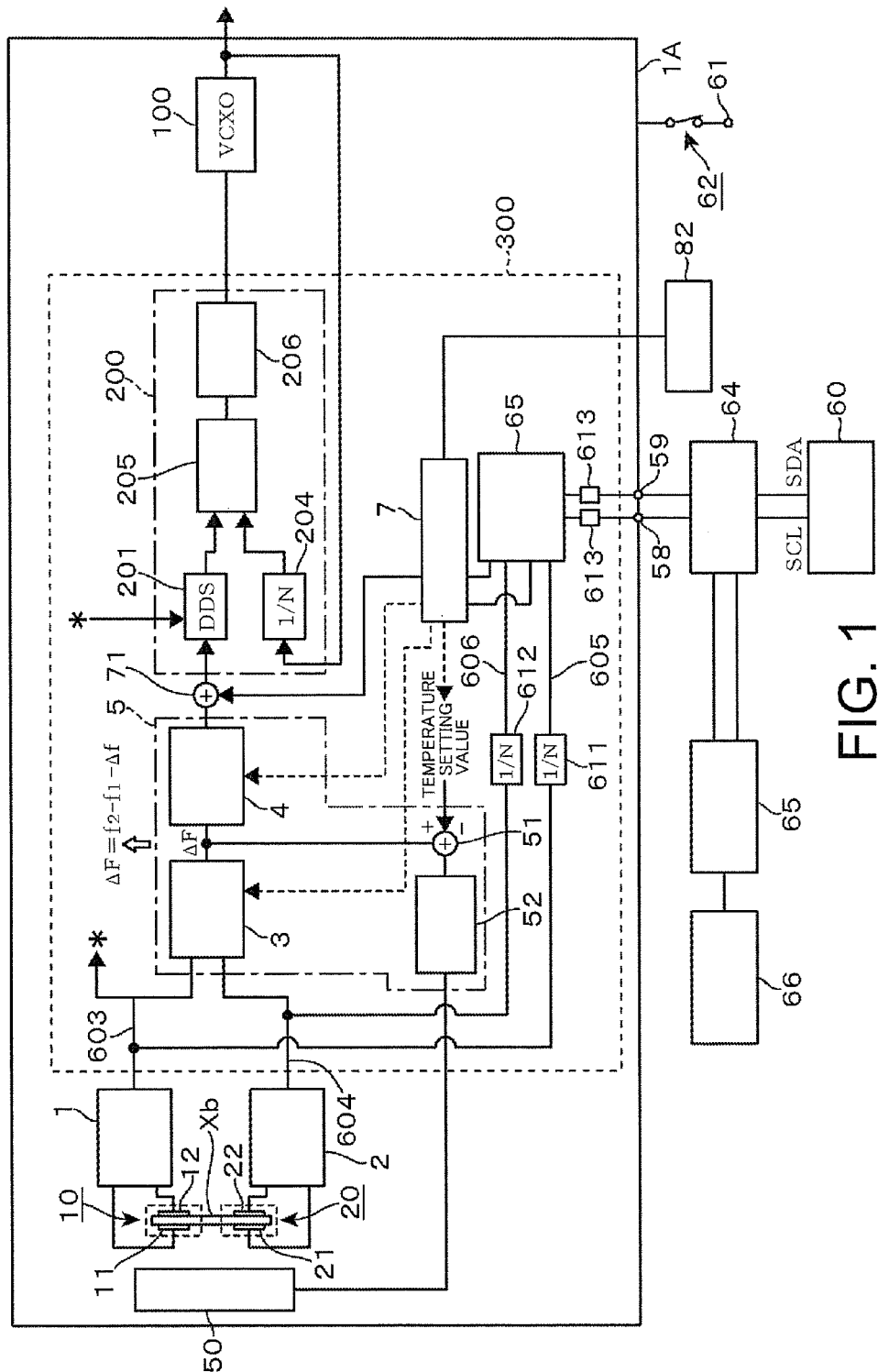
FIG. 1 is a block diagram illustrating an overall configuration of an oscillator according to this disclosure.

FIG. 1 is a block diagram illustrating an overall configuration of an oscillator 1A that uses a crystal oscillator according to an embodiment of this disclosure. The oscillator 1A is a frequency synthesizer that outputs a frequency signal having a setting frequency. The oscillator 1A includes a voltage controlled crystal oscillator 100, a control circuit unit 200, a crystal oscillator (reference numeral is not given), and a heater circuit 50. The voltage controlled crystal oscillator 100 includes a crystal unit. The control circuit unit 200 constitutes a Phase locked loop (PLL) in the voltage controlled crystal oscillator 100. The crystal oscillator generates a clock signal for operating a Direct Digital Synthesizer (DDS) circuit unit 201, which generates a reference signal of the PLL. The heater circuit 50 is a heat regulating unit that adjusts temperatures in an atmosphere, in which crystal units 10 and 20 in the crystal oscillator are placed. Accordingly, the above-described crystal oscillator is an Oven Controlled Crystal Oscillator (OCXO).

The control circuit unit 200 is a PLL, which includes the DDS circuit unit 201, a frequency divider 204, a phase frequency comparator 205, and a charge pump 206. The DDS circuit unit 201 outputs a reference clock signal (for reference). The frequency divider 204 frequency-divides a clock signal, which is output from the Voltage Controlled Crystal Oscillator (VCXO) 100. The phase frequency comparator 205 compares a phase of the reference clock signal with a phase of the frequency-divided clock signal. Then the charge pump 206 converts the phase difference, which is a comparison result, into an analog signal. The converted analog signal is input into a loop filter, and is controlled so as to stabilize the PLL. The DDS circuit unit 201 uses, as a reference clock signal, a frequency signal output from the first oscillator circuit 1, which is described below, and the DDS circuit unit 201 also receives frequency data (digital value) in order to output a signal having a target frequency.

Since a frequency of the reference clock signal has a temperature characteristic, a signal corresponding to a frequency correction value, which is described below, is added to the frequency data, which is input into the DDS circuit unit 201, in order to cancel the temperature characteristic. Correcting the frequency data, which is input into the DDS circuit unit 201, cancels a temperature variation of an output frequency of the DDS circuit unit 201 caused by the temperature characteristic variation of the reference clock signal, which results in a stable frequency of the reference clock signal regardless of temperature change. Accordingly, the voltage controlled crystal oscillator 100 outputs a signal with a stabilized frequency. That is, the above-described crystal oscillator is also configured as a temperature compensated crystal oscillator (TCXO), thus the oscillator 1A is configured as an oscillator having dual temperature control, which can stabilize its output with high accuracy.

The crystal oscillator includes a first crystal unit 10 and a second crystal unit 20. The first crystal unit 10 and the second crystal unit 20 share a common crystal element Xb. For example, a region of the strip-shaped crystal element Xb is divided into two regions in the longitudinal direction, then excitation electrodes are respectively formed on both front and back surfaces of respective divided regions (vibrating region). Then, the first crystal unit 10 is formed from one of the divided regions and a pair of electrodes 11 and 12. Also, the second crystal unit 20 is formed from the other one of the divided regions and a pair of electrodes 21 and 22.

The first crystal unit 10 and the second crystal unit 20 are respectively connected to a first oscillator circuit 1 and a second oscillator circuit 2. For convenience, it is premised that the first oscillator circuit 1 outputs a frequency signal having a frequency f1, and the second oscillator circuit 2 outputs a frequency signal having a frequency f2. The frequency signal having the frequency f1 is supplied to the control circuit unit 200 as a reference clock signal.

Reference numeral 3 denotes a frequency difference detector. The frequency difference detector 3 is, to say schematically, a circuit unit to extract a frequency of f2−f1−Δfr, which is a difference between a value Δfr and a difference between f1 and f2. The value Δfr is a difference between f1 (f1r) and f2 (f2r) at a reference temperature, which is, for example, 25° C. One exemplary difference between f1 and f2 is, for example, several MHz. The oscillator 1A is effective by, with the frequency difference detector 3, calculating ΔF, which is a difference between a value corresponding to a difference between f1 and f2 and a value corresponding to a difference between f1 and f2 at a reference temperature, which is, for example, 25° C. In particular, a value that can be obtained by the frequency difference detector 3 is {(f2−f1)/f1}−{(f2r−f1r)/f1r}.

Figure 2:
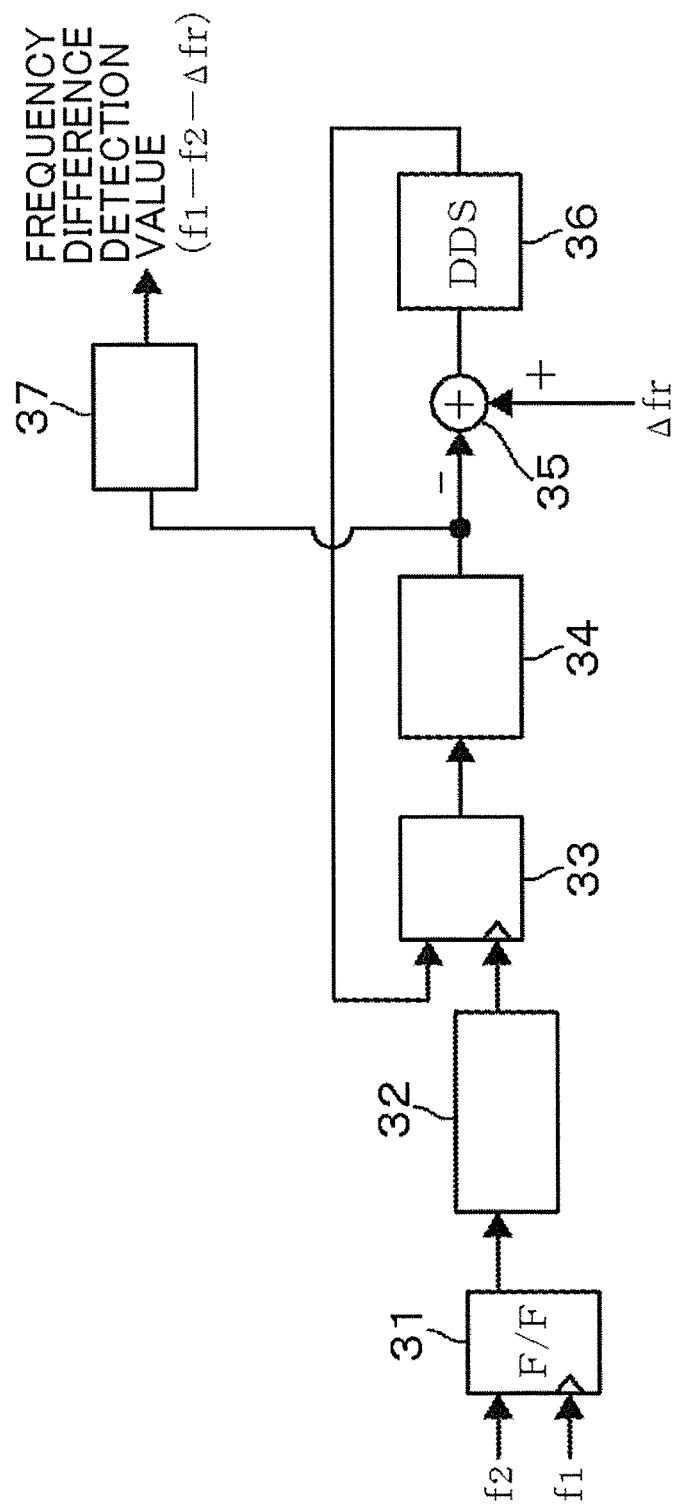
FIG. 2 is a block diagram illustrating a part of the oscillator.

FIG. 2 illustrates a concrete example of the frequency difference detector 3. Reference numeral 31 denotes a flip-flop circuit (F/F circuit). A frequency signal having the frequency f1 is input from the first oscillator circuit 1 to one of input ports of the flip-flop circuit 31. A frequency signal having the frequency f2 is input from the second oscillator circuit 2 to the other one of input ports of the flip-flop circuit 31. The frequency signal having the frequency f2 from the second oscillator circuit 2 is latched with the frequency signal having the frequency f1 from the first oscillator circuit 1. To avoid redundancy of the following description, hereinafter f1 and f2 are used for respectively indicating frequencies or frequency signals themselves. The flip-flop circuit 31 outputs a signal having a frequency (f2−f1)/f1, which is a value corresponding to a frequency difference between f1 and f2.

Figure 3:
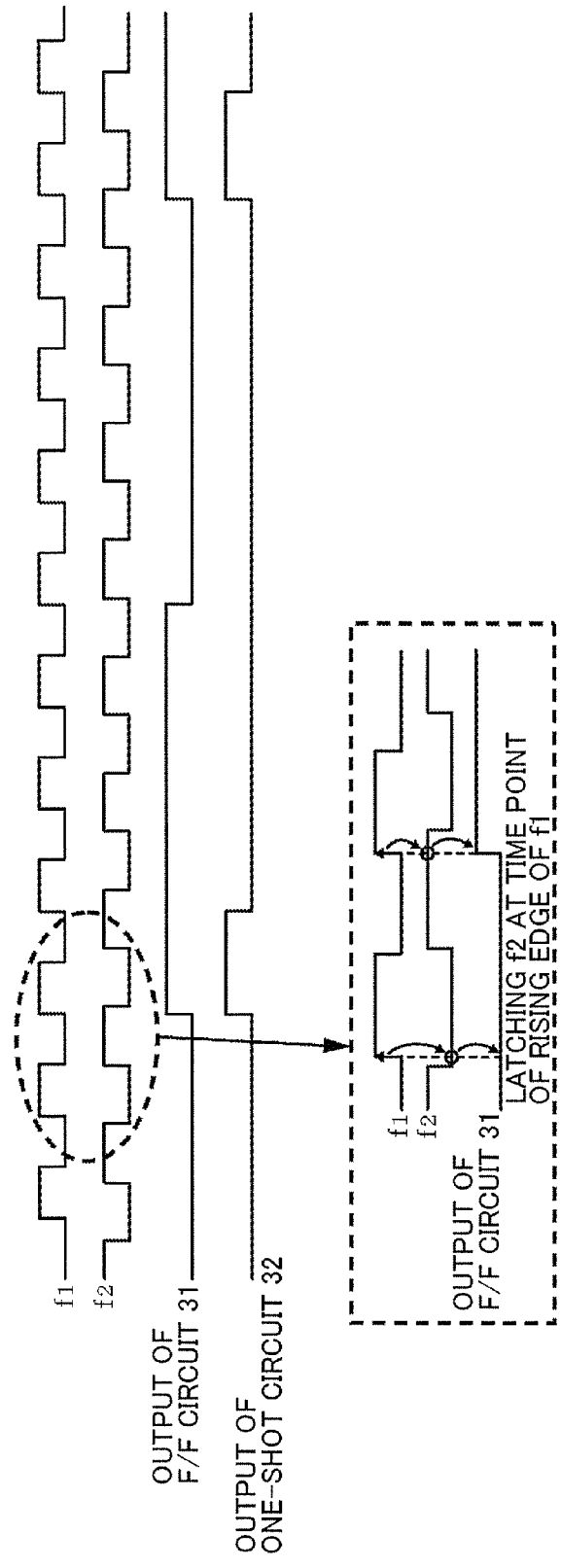
FIG. 3 is a diagram of waveforms output from the part of the oscillator shown in FIG. 2.

At a subsequent stage of the flip-flop circuit 31, a one-shot circuit 32 is disposed. The one-shot circuit 32 outputs a one-shot pulse at the rising edge of the pulse signal, which is obtained from the flip-flop circuit 31. FIG. 3 is a timing chart of a series of signals described by this point. At a subsequent stage of the one-shot circuit 32, the PLL is disposed. The PLL includes a latch circuit 33, a loop filter 34 having an integrating function, an addition unit 35, and a direct digital synthesizer (DDS) circuit unit 36. The latch circuit 33 latches a saw-tooth wave, which is output from the DDS circuit unit 36, using a pulse output from the one-shot circuit 32. The output of the latch circuit 33 has a signal level of the saw-tooth wave at a time point when the pulse is output. The loop filter 34 integrates a DC voltage having this signal level. The addition unit 35 adds this DC voltage to a DC voltage corresponding to Δfr (difference between f1 and f2 at a reference temperature, which is, for example, 25° C.).

The DDS circuit unit 36 receives a DC voltage computed by the addition unit 35, which is a voltage obtained by subtracting an output voltage of the loop filter 34 from a DC voltage corresponding to Δfr, then the DDS circuit unit 36 outputs a saw-tooth wave having a frequency corresponding to this voltage value. For easy understanding of the operation of the PLL, the outputs of respective portions of the PLL are extremely schematically illustrated in FIGS. 4A through 4C, and are extremely schematically explained for intuitive understanding. Immediately after the apparatus is activated, the DDS circuit unit 36 receives a DC voltage corresponding to Δfr, which is, for example, 5 MHz, via the addition unit 35, then the DDS circuit unit 36 outputs a saw-tooth wave corresponding to this frequency.

The saw-tooth wave is latched with a pulse having a frequency corresponding to (f2−f1) by the latch circuit 33. If (f2−f1) is, for example, 6 MHz, which is in a state where a period of the pulse used for latching is shorter than that of the saw-tooth wave, the latch points of the saw-tooth wave is gradually lowered as shown in FIG. 4A, then the output of the latch circuit 33 and the output of the loop filter 34 gradually decrease to minus side as shown in FIGS. 4B and 4C. Since the sign of the output side of the loop filter 34 to the addition unit 35 is "−", a DC voltage input from the addition unit 35 to the DDS circuit unit 36 is increased. This increases a frequency of the saw-tooth wave, which is output from the DDS circuit unit 36. When a DC voltage corresponding to 6 MHz is input into the DDS circuit unit 36, a frequency of the saw-tooth wave becomes 6 MHz, which locks the PLL as shown in FIGS. 5A through 5C. At this point, a DC voltage output from the loop filter 34 have a value corresponding to Δfr−(f2−f1)=−1 MHz. In other words, it can be considered that an integral value of the loop filter 34 corresponds to an integral value of a variation amount for 1 MHz when the saw-tooth wave changes from 5 MHz to 6 MHz.

In contrast, if Δfr is 6 MHz, and (f2−f1) is 5 MHz, which is in a state where a period of the pulse used for latching is longer than that of the saw-tooth wave, the latch points shown in FIG. 4A gradually rise, then the output of the latch circuit 33 and the output of the loop filter 34 is also increased. This makes a value subtracted at the addition unit 35 increase, then the frequency of the saw-tooth wave gradually decrease, and then reaches 5 MHz, which is the same value as (f2−f1), which locks the PLL. At this point, a DC voltage output from the loop filter 34 has a value corresponding to Δfr−(f2−f1)=1 MHz.

Incidentally as described above, in practice, an output of the frequency difference detector 3, which is an output of an averaging circuit 37 shown in FIG. 2 has a 34-bit digital value of {(f2−f1)/f1}−{(f2r−f1r)/f1r}. Assuming that the collection of these values from around −50° C. to around 100° C. is (f1−f1r)/f1=OSC1 (unit is ppm or ppb) and (f2−f2r)/f2r=OSC2 (unit is ppm or ppb), a variation relative to the temperature has the substantially same curve as that of OSC2−OSC1. Accordingly, the output of the frequency difference detector 3 can be used as OSC2−OSC1=temperature data.

In addition, the operation in which f2 is latched with f1 by the flip-flop 31 is asynchronous. This may result in an indefinite interval such as a metastable period (a period when an output is unstable since clock signal and input data change approximately simultaneously even though the input data should be held for a certain period of time before and after a time point of the edge at which the latch is performed when the input data is latched at an edge of the clock). Accordingly, an instantaneous error may occur at the output of the loop filter 34. Therefore, the averaging circuit 37, which computes a moving average of input values within a pre-set period of time, is provided at the output side of the loop filter 34 to remove an instantaneous error even it occurs.

Figure 6:
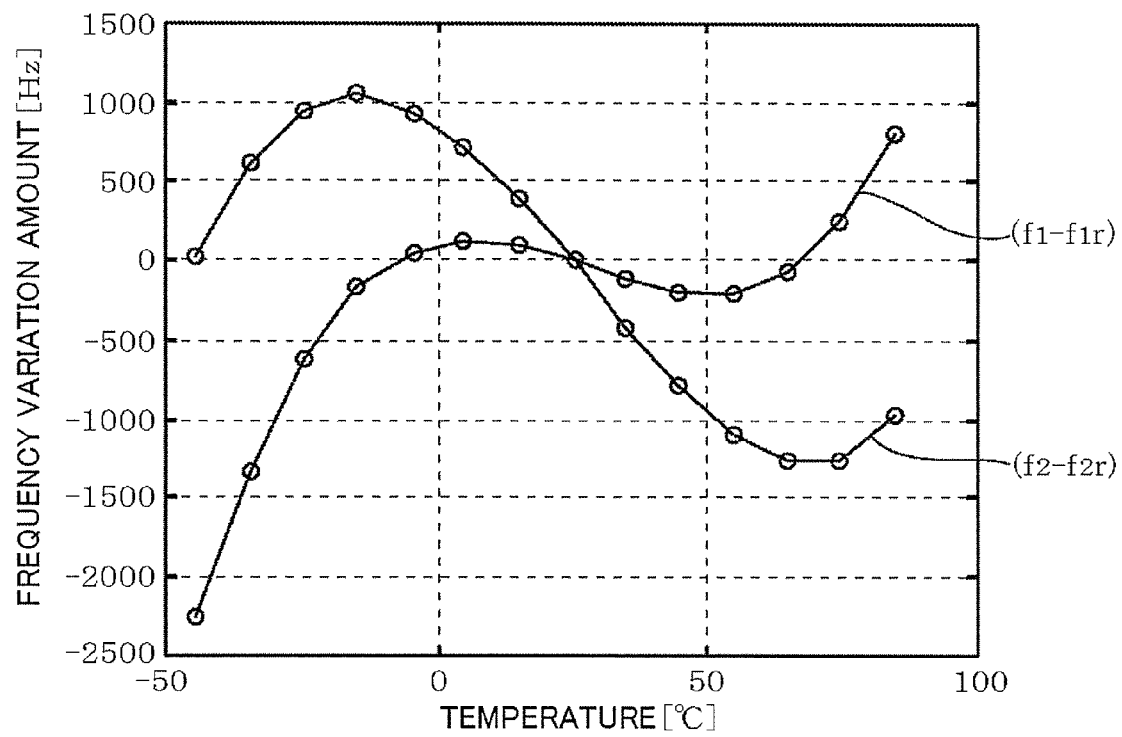
FIG. 6 is a frequency versus temperature characteristic graph illustrating a relation between a frequency f1 of a first oscillator circuit or a frequency f2 of a second oscillator circuit and temperature.
Figure 7:
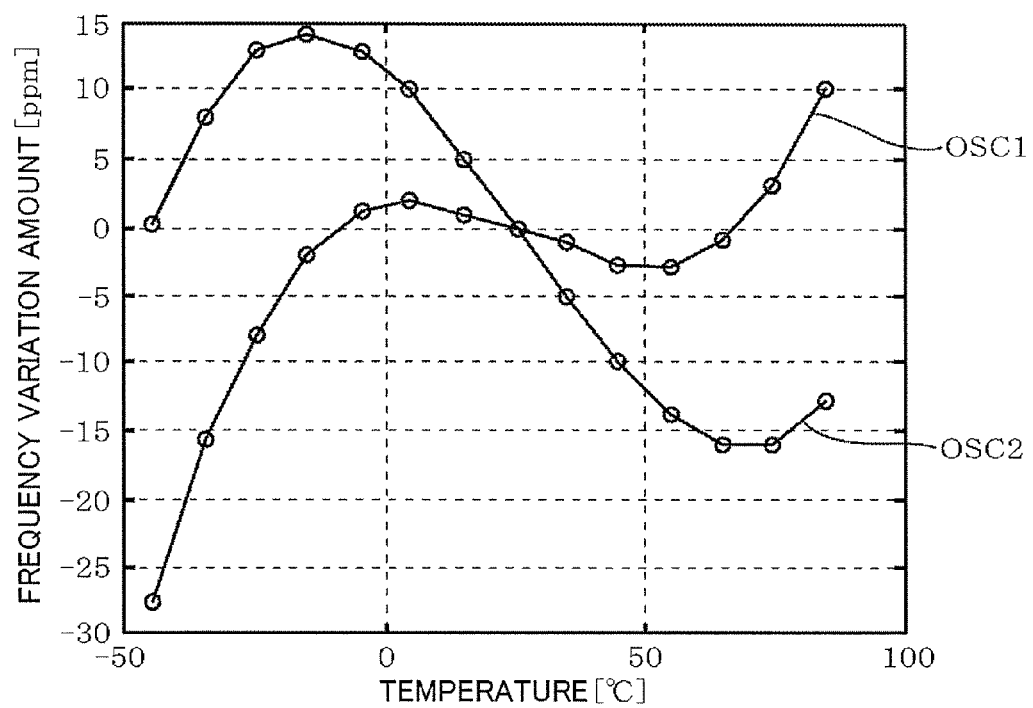
FIG. 7 is a frequency versus temperature characteristic graph illustrating a relation between values of f1 or f2, which are respectively normalized, and temperature.
Figure 8:
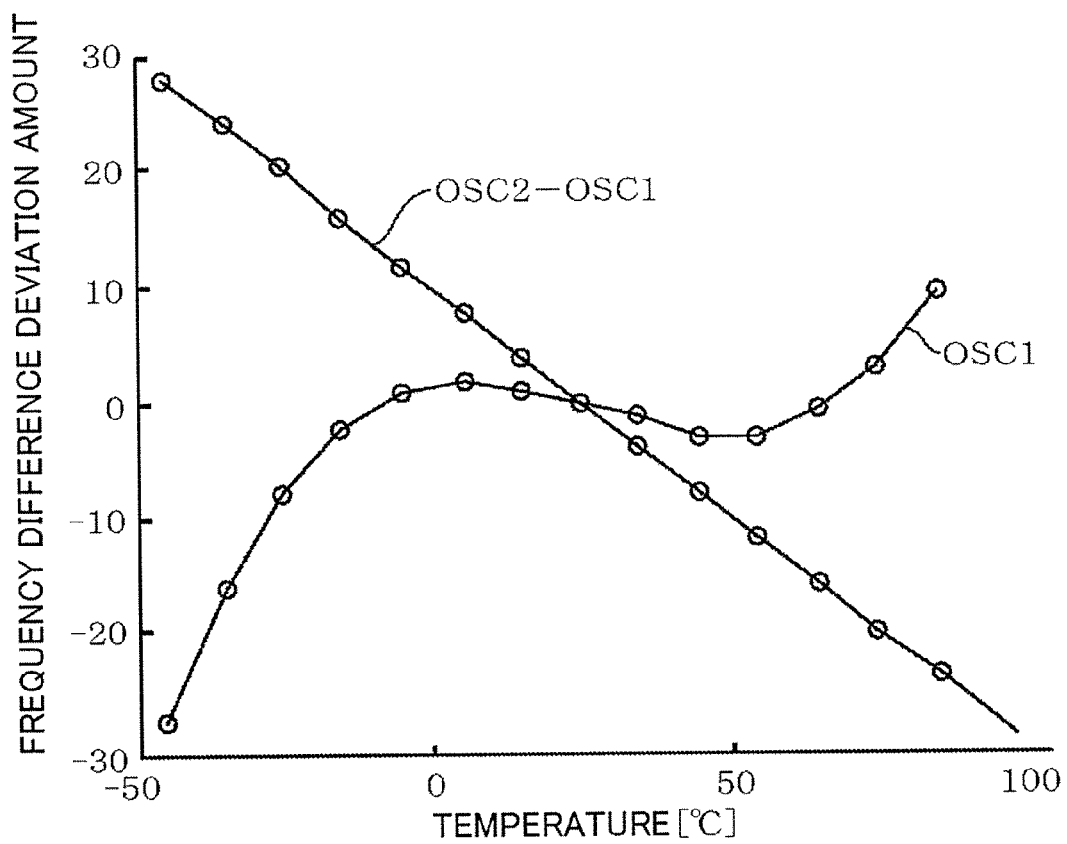
FIG. 8 is a frequency versus temperature characteristic graph illustrating a relation between a normalized value of f1 and a temperature, and a relation between a difference ΔF, which is a difference between a normalized value of f1 and a normalized value of f2, and temperature.

The following describes OSC2−OSC1, which is frequency deviation information of a temperature variation amount obtained at the loop filter 34 of the PLL, with reference to FIG. 6 through FIG. 8. FIG. 6 is a characteristic graph illustrating a relation between a temperature and a frequency where f1 and f2 are normalized by a reference temperature. Note that, "normalization" means obtaining a relation between a temperature and a deviation amount of frequency from the frequency at the reference temperature. At this time the reference temperature is set to, for example, 25° C., and the frequency at the reference temperature is set to zero in a relation between a temperature and a frequency. If f1r is a frequency of the first oscillator circuit 1 at 25° C., while f2r is a frequency of the second oscillator circuit 2 at 25° C., values indicated by the vertical axis in FIG. 7 are (f1−f1r) and (f2−f2r).

In addition, FIG. 7 illustrates a variation rate of a frequency at each temperature shown in FIG. 6 relative to a frequency at the reference temperature (25° C.). Accordingly, the values indicated by the vertical axis in FIG. 7 are (f1−f1r)/f1r and (f2−f2r)/f2r (unit: ppm), which is OSC1 and OSC2, as described above. FIG. 8 illustrates a relation between OSC1 and a temperature, and a relation between (OSC2−OSC1) and a temperature. It can be seen that (OSC2−OSC1) forms a straight line relative to temperature. Accordingly, it can be seen that (OSC2−OSC1) corresponds to a deviation amount of temperature variation from the reference temperature.

Now returning to FIG. 1, an output value of the frequency difference detector 3 is practically (OSC2−OSC1), and this value can be a temperature detection value in an atmosphere where the crystal units 10 and 20 are placed. Then, an addition unit (deviation amount extraction circuit) 51 is disposed at a subsequent stage of the frequency difference detector 3, so as to extract a difference between a temperature setting value, which is a digital signal (34-bit digital value of OSC2−OSC1 at setting temperature), and OSC2−OSC1, which is an output from the frequency difference detector 3. In order to reduce a variation of the value of OSC1 due to temperature change, the temperature setting value is selected to be set, for example, 50° C., which corresponds to a bottom part of a curve, which is shown in FIG. 8, indicating a relation between the OSC1 and the temperature.

Then, a heater control circuit 52 is disposed at a subsequent stage of the addition unit 51. The heater control circuit 52 converts a digital signal, which is output from the addition unit 51, into a corresponding DC voltage, and supplies the converted voltage to the heater circuit 50 as a control signal. The heater circuit 50 includes a heating resistor, and generates a heat in response to the supplied DC voltage. That is, the heat generation temperature of the heater circuit 50 is controlled according to a difference between the above-described temperature data and the temperature setting value. FIG. 1 illustrates the frequency difference detector 3, a correction value operator 4, the addition unit 51 and the heater control circuit 52 as a signal processing unit 5.

In addition, the oscillator 1A performs temperature compensation of the reference clock signal, which is input to the control circuit unit 200 as described above. The correction value operator 4, which is shown in FIG. 1, receives frequency deviation information of the temperature variation amount obtained at the loop filter 34 of the PLL, and computes a correction value of the frequency. As shown in FIG. 8, (OSC2−OSC1) has a linear relation with the temperature, and corresponds to the deviation amount of temperature variation from the reference temperature. In general, obtaining the relation between (OSC2−OSC1) and a frequency correction value, which cancels the amount of frequency variation due to frequency versus temperature characteristic of the crystal unit, results in the frequency correction value based on the detected value of (OSC2−OSC1).

Figure 9:
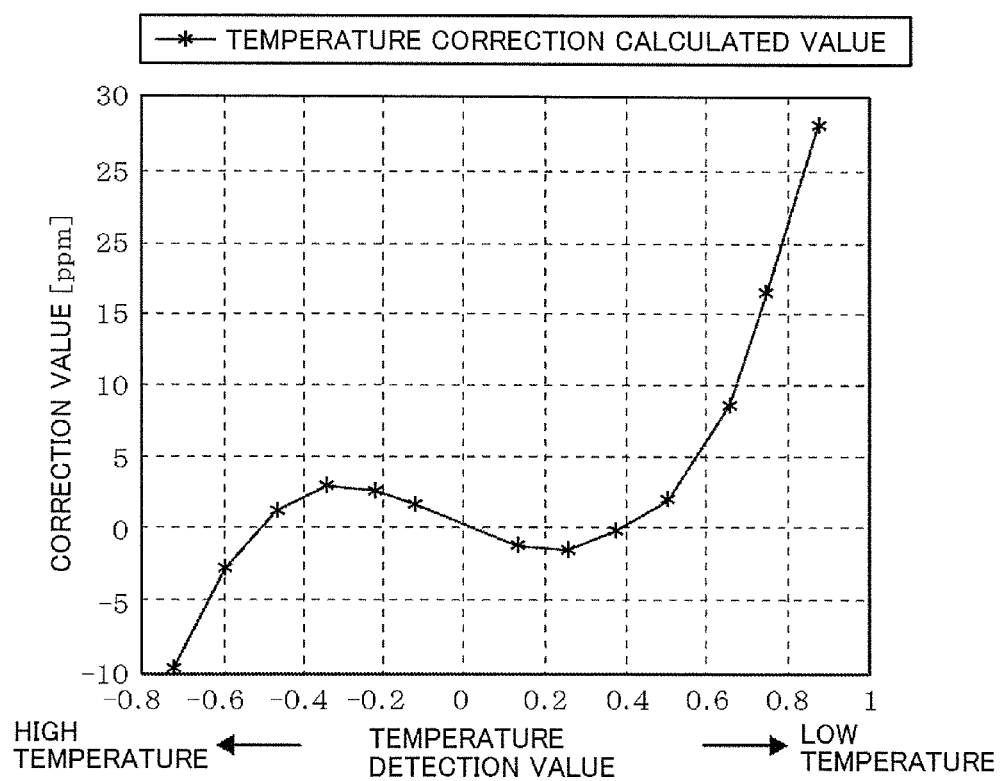
FIG. 9 is a characteristic graph illustrating a relation between normalized values in the vertical axis of FIG. 8 and a frequency correction value.

As described above, the oscillator 1A of this embodiment uses a frequency signal (f1), which is obtained from the first oscillator circuit 1, as the reference clock signal of the control circuit unit 200, which is shown in FIG. 1. This reference clock has a frequency versus temperature characteristic, then the oscillator 1A performs temperature correction with respect to the frequency of the reference clock. Accordingly, first, a function indicating a relation between a temperature and f1, which is normalized at the reference temperature, is obtained. Then, a function for canceling a frequency variation amount of f1, which is calculated by the above-described function is obtained as shown in FIG. 9. More particularly, the f1 of the function is (f1−f1r)/f1r=OSC1, which indicates a variation rate of the frequency at the reference temperature. Accordingly, the vertical axis in FIG. 9 indicates the values of −OSC1. The horizontal axis in FIG. 9 indicates the normalized values of OSC2−OSC1. In this example, the values are normalized such that (OSC2−OSC1) corresponds to +1 at −30 ppm, and (OSC2−OSC1) corresponds to −1 at +30 ppm. Note that, in the explanation of FIGS. 7 through 9 according to the above-described embodiment, the frequency variation is expressed in "ppm" units. However, all values are expressed as binary numbers in the actual digital circuit. Therefore, frequency setting accuracy of the DDS circuit unit 36 is calculated in the structured bit number, for example, 34 bits.

In this example, the frequency characteristic of the crystal unit relative to the temperature is expressed by a ninth-order polynomial approximation formula. The correction value operator 4 computes a formula (1) using these polynomial approximation formula coefficients.

$$Y = P1 \cdot X^9 + P2 \cdot X^8 + P3 \cdot X^7 + P4 \cdot X^6 + P5 \cdot X^5 + P6 \cdot X^4 + P7 \cdot X^3 + P8 \cdot X^2 + P9 \cdot X \quad (1)$$

Figure 10:
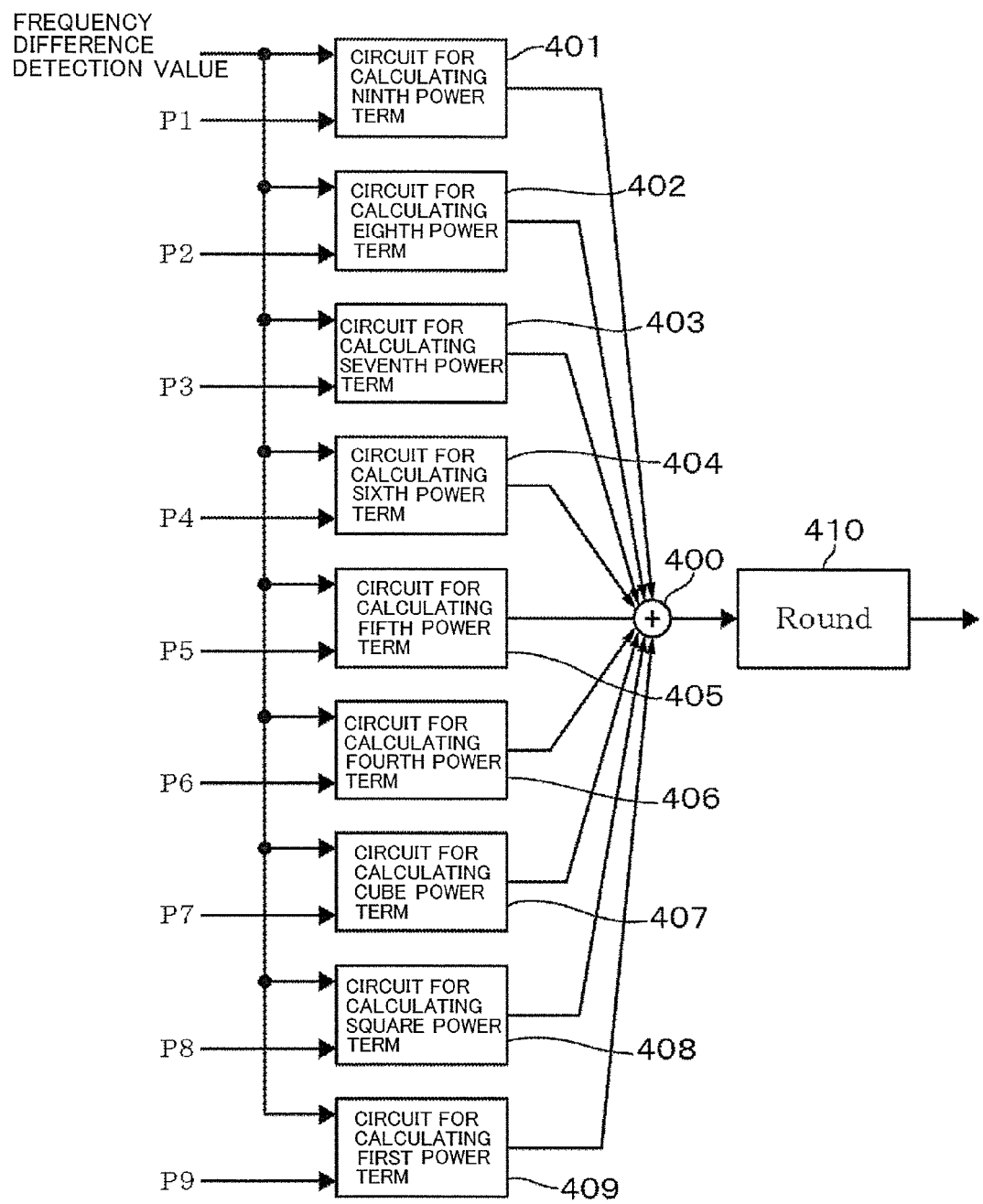
FIG. 10 is a block diagram illustrating a correction value operator.

In the formula (1), X represents frequency difference detection information; Y represents correction data; P1 through P9 represent polynomial approximation formula coefficients. In particular, X is a value obtained by the frequency difference detector 3 shown in FIG. 1, that is a value (OSC2−OSC1) obtained by the averaging circuit 37 shown in FIG. 2. FIG. 10 is a block diagram illustrating the correction value operator 4. In FIG. 10, reference numerals 401 through 409 denote operators performing an operation of each term of the formula (1), reference numeral 400 denotes an addition unit, and reference numeral 410 denotes a circuit to perform rounding process. As described above, the formula (1) is set based on a relation between an amount of variation from f1 at the reference temperature of f1, and a signal corresponding to a difference between f1 and f2, then a value Y, which is obtained from the formula (1), corresponds to a frequency correction value relative to f1 at the reference temperature.

The following summarizes the operation of the oscillator 1A in normal operation. Focusing on the crystal oscillator of this oscillator 1A, an output from the crystal oscillator corresponds to a frequency signal output from the first oscillator circuit 1. The heater circuit 50 increases a temperature at an atmosphere in which the crystal units 10 and 20 are placed to a setting temperature. The first crystal unit 10 and the first oscillator circuit 1 generate a frequency signal, which is an output of the crystal oscillator, as well as work as a temperature detection unit for detecting a temperature value with the second crystal unit 20 and the second oscillator circuit 2. A value OSC2−OSC1, which corresponds to a difference between frequencies of frequency signals, which are respectively obtained from the oscillator circuits 1 and 2, corresponds to a temperature at the atmosphere in which the crystal units 10 and 20 are placed as described above. Then, the addition unit 51 extracts the difference from the temperature setting value.

This difference is converted into a DC voltage, with which control power of the heater circuit 50 is adjusted. For example, if a value of OSC1 at 50° C. is $-1.5 \times 10^5$, an output of the addition unit 51 is a positive value at a temperature below 50° C., and gradually increases as temperature decreases. Accordingly, the control power of the heater circuit 50 increases, as temperature in the atmosphere in which the crystal units 10 and 20 are placed decreases from 50° C. The output of the addition unit 51 is a negative value when temperature in the atmosphere is above 50° C., and the absolute value thereof increases as temperature increases. Accordingly, the control power of the heater decreases, as temperature increases from 50° C. Thus, temperature in the atmosphere in which the crystal units 10 and 20 are placed is attempted to be maintained at 50° C., which is the setting temperature. This stabilizes an output frequency of the first oscillator circuit 1, which is an oscillation output. Consequently, a frequency of a reference signal, which is supplied to the phase frequency comparator 205, is stabilized in the control circuit unit 200 that uses an output signal from the first oscillator circuit 1 as a clock signal, which stabilizes the output frequency from the voltage controlled crystal oscillator 100, which is an output of the oscillator 1A (frequency synthesizer).

On the other hand, an output (OSC2−OSC1) from the frequency difference detector 3 is input to the correction value operator 4. The frequency difference detector 3 computes a frequency correction amount, which is temperature correction data, using the above-described formula (1). In the characteristic graph shown in FIG. 9, the computation of the formula (1) is a process for obtaining a value of the vertical axis of the correction frequency curve corresponding to a value obtained based on an output value of the frequency difference detector 3.

The first crystal unit 10 and the second crystal unit 20 share the common crystal element Xb, therefore a frequency difference between the oscillator circuits 1 and 2 is a value accurately corresponding to environmental temperature. Accordingly, an output of the frequency difference detector 3 is temperature difference information between the environmental temperature and the reference temperature (25° C. in this example). The frequency signal f1 output from the first oscillator circuit 1 is used as a main clock signal of the control circuit unit 200. Therefore, the correction value obtained by the correction value operator 4 is used as a signal for compensating operation of the control circuit unit 200 to cancel an influence to the operation of the control circuit unit 200 based on a frequency deviation amount of f1 due to deviation of the temperature from 25° C. Note that, the crystal units 10 and 20 may include individual crystal elements.

Incidentally, a description is given as if a signal corresponding to a temperature compensation value obtained by the correction value operator 4 were input into the control circuit unit 200. In practice, the addition unit 71 shown in FIG. 1 adds a signal output from a microcontroller 7, which constitutes the oscillator 1A, to the signal corresponding to the temperature compensation value, and the addition unit 71 outputs the added signal as a control signal to the control circuit unit 200. The oscillator 1A is configured to change its output frequency with respect to a nominal frequency, which is determined by a manufacturer, by changing a correction output signal (frequency data), which is output from the microcontroller 7 to the addition unit 71 using an external computer 60.

The microcontroller 7 transmits information, which is unique for each oscillator, such as a correction output signal to the above-described addition unit 71 for changing a frequency, the coefficients P1 through P9, a voltage signal corresponding to the above-described Δfr, a temperature setting value to be output to the addition unit 51. In addition, assume that a mode in which the oscillator 1A extracts a desired oscillation output from the VCXO (Voltage Controlled Crystal Oscillator) 100 as described above is referred to as a normal operation mode of the oscillator 1A, while a mode in which oscillator 1A extracts signals respectively corresponding to f1 and f2 not for oscillation output but for measurement of f1 and f2 is referred to as a frequency measurement mode, the oscillator 1A operates with switching between the normal operation mode and the frequency measurement mode. This frequency measurement mode is performed to, for example, set the above-described coefficients P1 through P9, and the microcontroller 7 also controls switching operation of these modes.

Figure 11:
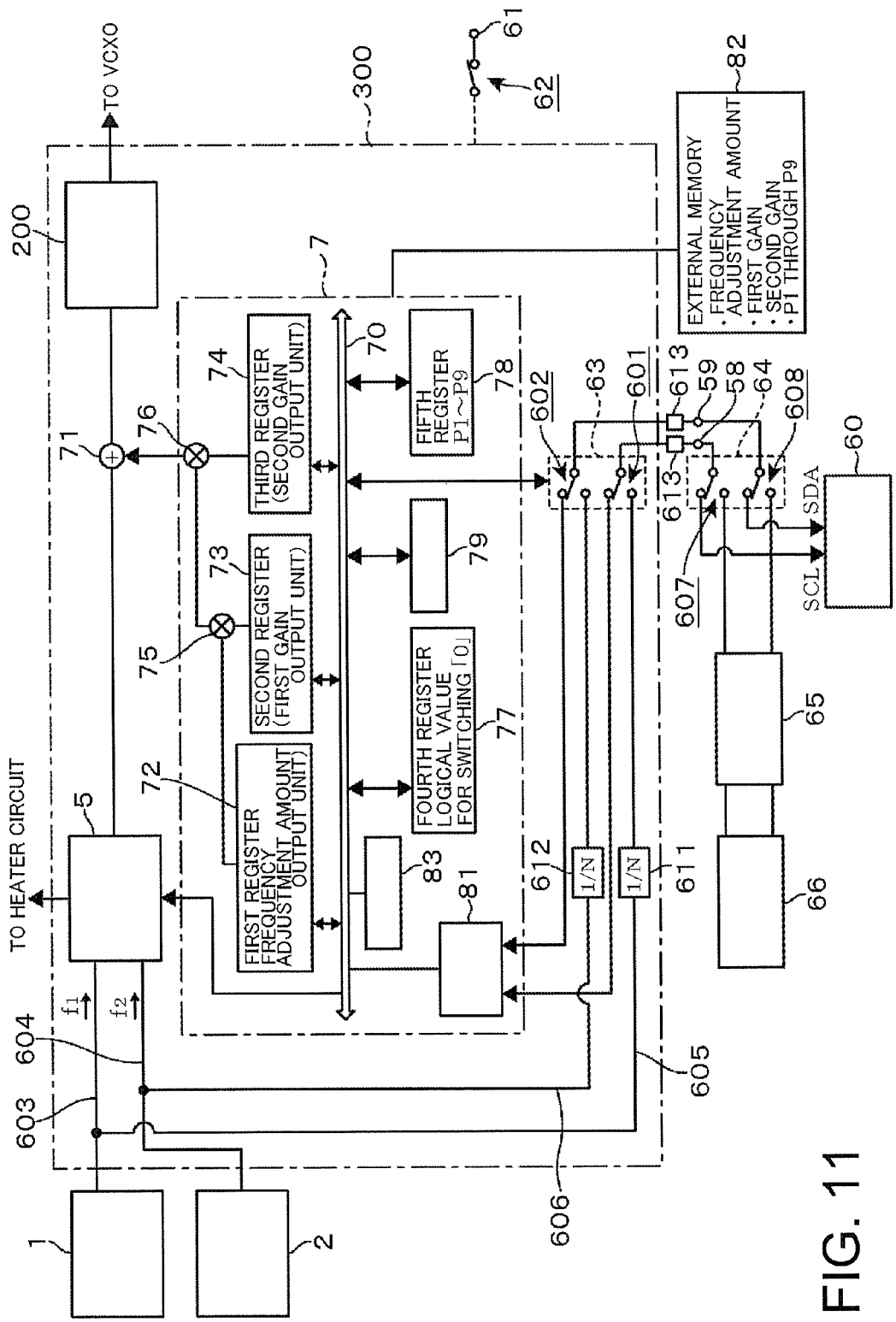
FIG. 11 is a block diagram of a microcontroller that constitutes the oscillator.

The following describes a configuration of the microcontroller 7 with reference to FIG. 11. Reference numeral 72 denotes a first register corresponding to a frequency adjustment amount output unit. For example, the first register 72 sets a frequency adjustment amount using a 24-bit digital value expressed by complements of two. The frequency adjustment amount is a value with which a user set a ratio relative to the nominal frequency within a variable width set by a manufacturer. After the frequency adjustment amount is determined, a frequency corresponding to the ratio is added to the nominal frequency, the added value is output to the addition unit 71. Also, the microcontroller 7 includes a second register 73 and a third register 74. Reference numerals 75 and 76 respectively denote multiplication units. Reference numeral 70 in FIG. 11 denotes a bus. The registers 73 and 74 respectively store a first gain G1 and a second gain G2, which are multiplied by a frequency adjustment amount set by the first register 72, then a value of the above-described frequency adjustment amount×G1×G2 varies, which causes an output to the addition unit 71 to change, then the oscillation frequency changes. In practice, the microcontroller 7 includes another register, other than the registers shown in FIG. 11. This register stores 32-bit digital data corresponding to the nominal frequency. And this digital data is added to a value output from the multiplication unit 76, then the added value is output to the addition unit 71.

The first gain G1 is expressed as an 8-bit digital value, which is expressed by, for example, complements of two. The second gain G2 is a value for rounding (multiplying $2^{-n}$ (n is a natural number)) a value obtained by multiplying the frequency adjustment amount by the first gain G1. Each gain is set such that the frequency variable width changes from the minimum value to the maximum value, which have been determined by a manufacturer, by changing the frequency adjustment amount from the minimum value to the maximum value.

The microcontroller 7 includes a fourth register 77 for switches the above-described modes. A logical value "0" or "1" is written in the fourth register 77, which is a logical value for switching the modes, then the microcontroller 7 controls switching operation of a connection switching unit 63 using the logical value. Also, the microcontroller 7 includes a fifth register 78 for storing unique information of the oscillator 1A such as the above-described coefficients P1 through P9, Δfr, and temperature setting value output to the addition unit 51. Each piece of unique information being read out to the signal processing unit 5. The registers 72 through 74, 77, and 78 constitute a storage unit. The register 77 is a storage region for switching connect states.

The microcontroller 7 includes a power-on reset circuit 79 as a reset unit. The power-on reset circuit 79 initializes data of each above-described register and writes "0" when the power source of the oscillator 1A is turned on. In FIG. 11, reference numeral 61 denotes an input terminal of the power source. Reference numeral 62 denotes a switch that switches the on/off state of the power source. In addition, the microcontroller 7 includes an interface circuit 81 for communicating with the external computer 60, which is connected to the oscillator 1A.

The following describes an external configuration of the microcontroller 7. The oscillator 1A includes connection switching unit 63, which includes switches 601 and 602. Reference numeral 603 denotes a signal path connecting the first oscillator circuit 1 and the signal processing unit 5, while reference numeral 604 denotes a signal path connecting the second oscillator circuit 2 and the signal processing unit 5. Then signal paths 605 and 606 are respectively connected to the signal paths 603 and 604. Frequency dividers 611 and 612 are respectively connected to the signal paths 605 and 606. Reference numerals 613 and 613 respectively denote buffer circuits in FIG. 11.

The switch 601 switches a connection of a first connecting terminal 58 between the above-described interface circuit 81 and the signal path 605. The switch 602 switches a connection of a second connecting terminal 59 between the interface circuit 81 and the signal path 606. As described above, the switching operations of the switches 601 and 602 are controlled in response to a logical value for switching, which is written in the fourth register 77. The switches 601 and 602 are switched such that the interface circuit 81 is connected to the first and second connecting terminals 58 and 59 when the above-described logical value is "0", while the signal paths 605 and 606 are respectively connected to the first and second connecting terminals 58 and 59 when the logical value is "1".

The following describes an external configuration of the oscillator 1A. In this example, a connection switching tool 64 is provided for quick switching operation between the frequency measurement mode and the normal operation mode. The external computer 60 is connected to the connection switching tool 64 via an I²C (Inter-Integrated Circuit) bus. In FIG. 11, respective signal lines of serial clock and serial data, which constitute the I²C bus, are indicated as SCL and SDA. Also, the I²C bus constitutes signal paths, which respectively connect the connection switching tool 64 and the first and second connecting terminals 58 and 59, and signal paths, which respectively connect the first and second connecting terminals 58 and 59 and the interface circuit 81.

A frequency counter 66, which is a frequency measuring unit, is connected to the connection switching tool 64 via a buffer circuit 65. The connection switching tool 64 includes switches 607 and 608. As described above, the switches 607 and 608 respectively switch connections of the first and second connecting terminals 58 and 59 between the buffer circuit 65 and the external computer 60. Each of the switches 607 and 608 of the connection switching tool 64 can be switched by the external computer 60.

As described later, during the normal operation mode, the external computer 60 is connected to the microcontroller 7, that is, the first through fifth registers, and each switch of the connection switching unit 63 and the connection switching tool 64 is switched so as to rewrite data in each register. In other words, during the normal operation mode, a user can change a frequency adjustment amount in the above-described first register 72 from the external computer 60 to change the above-described nominal frequency. Then, during the frequency measurement mode, each of the above-described switches is switched so as to connect the first oscillator circuit 1 and the second oscillator circuit 2 to the frequency counter 66.

The oscillator 1A is connected to an external memory 82, which is a non-volatile memory, for example, an Electrically Erasable Programmable ROM (EEPROM), the external memory 82 is disposed at outside of the oscillator 1A. The external memory 82 stores each piece of unique information to be stored in the above-described first through third registers 72 through 74 and fifth register 78. After the power source is turned on, the each piece of unique information can be read into the corresponding respective registers by a program 83 stored in the microcontroller 7 for operation of the oscillator 1A. The external computer 60 can access this external memory 82 to set each piece of unique information.

The following describes a reason why the frequency dividers 611 and 612 are provided. The I²C bus is fabricated in accordance with a predefined standard, then the buffer circuit 613 is also fabricated in accordance with the predetermined standard. In this standard, the maximum transmission speed is set, for example, around 5 Mbps. If frequencies of oscillation signals f1 and f2, which are input from the first oscillator circuit 1 and the second oscillator circuit 2, are out of the standard, the signals having decreased amplitude may be disadvantageously output to the connecting terminals 58 and 59 via the buffer circuit 613, or the detection of the signals may be difficult, or no signal may be output. It is considered to decrease pull-up resistance at outside of the I²C bus to solve this problem. However, this may cause damage of transistors in buffer circuit 613, or an appropriate output level cannot be ensured.

Therefore, the frequency dividers 611 and 612 are provided to divide the frequencies of the output signals f1 and f2 from the oscillator circuits 1 and 2, the frequency-divided signals are extracted to the frequency counter 66 via the I²C bus. In order to avoid the above-described problem caused by the I²C bus communication, the respective frequency dividers 611 and 612 have frequency-dividing rates N, which are set to an integral numbers equal to or more than 2 such that a signal having frequency of, for example, equal to or less than 400 kHz can be output. For example, if the respective frequency dividers 611 and 612 have the frequency-dividing rates N, which are set to 256, and the oscillation signals f1 and f2 have frequencies of, for example, equal to or more than 80 MHz, the frequency dividers 611 and 612 output signals having a frequency of around 312.5 kHz to the connecting terminals 58 and 59.

Figure 12:
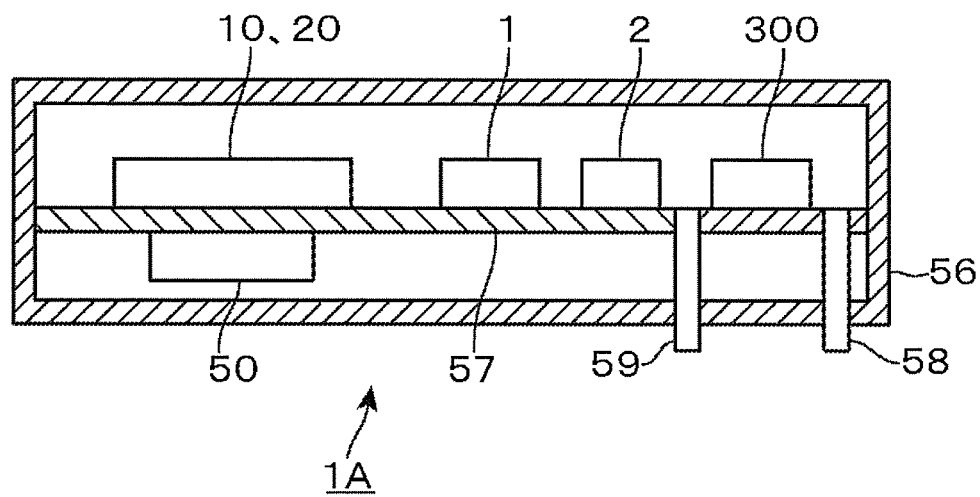
FIG. 12 is a schematic longitudinal cross-sectional side view of the oscillator.

FIG. 12 is a longitudinal cross-sectional side view illustrating a schematic configuration of the oscillator 1A shown in FIG. 1. Reference numeral 56 denotes a container, and reference numeral 57 denotes a printed circuit board disposed in the container 56. A printed circuit board 57 includes the crystal units 10 and 20, the oscillator circuits 1 and 2, and an integrated circuit unit 300 on the front upper surface. The integrated circuit unit 300 includes the signal processing unit 5, the control circuit unit 200, the microcontroller 7, the connection switching unit 63 and the frequency dividers 611 and 612. Also, the printed circuit board 57 includes, for example, the heater circuit 50, which faces the crystal units 10 and 20, on the back lower surface. The printed circuit board 57 includes the first connecting terminal 58 and the second connecting terminal 59, which are connected to the integrated circuit unit 300 via a wiring (not shown) formed on the printed circuit board 57. The connecting terminals 58 and 59 have distal ends projecting from the container 56, and are connected to the frequency counter 66 or the external computer 60 via the connection switching tool 64.

Figure 14:
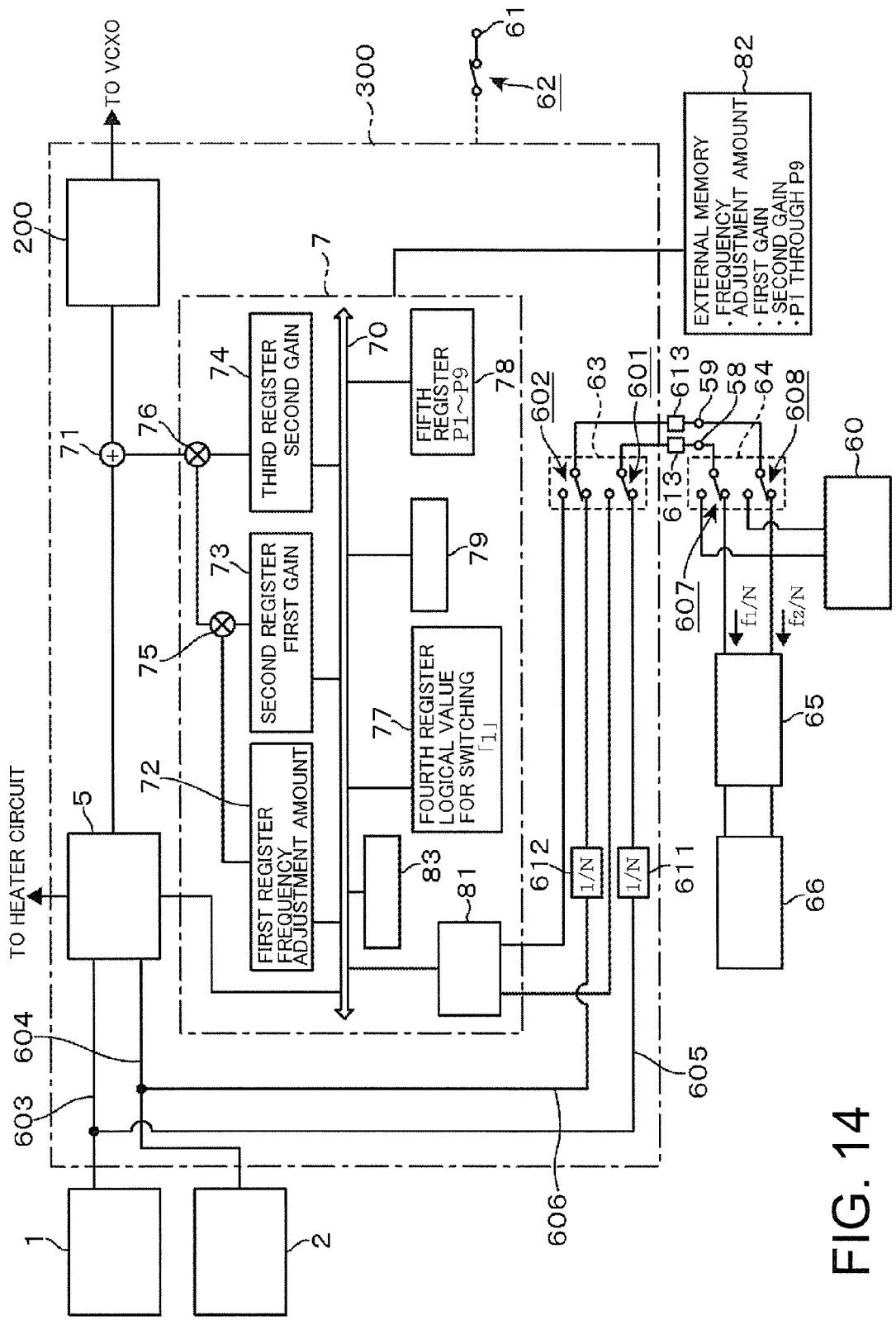
FIG. 14 is an operation diagram illustrating a switching operation.
Figure 15:
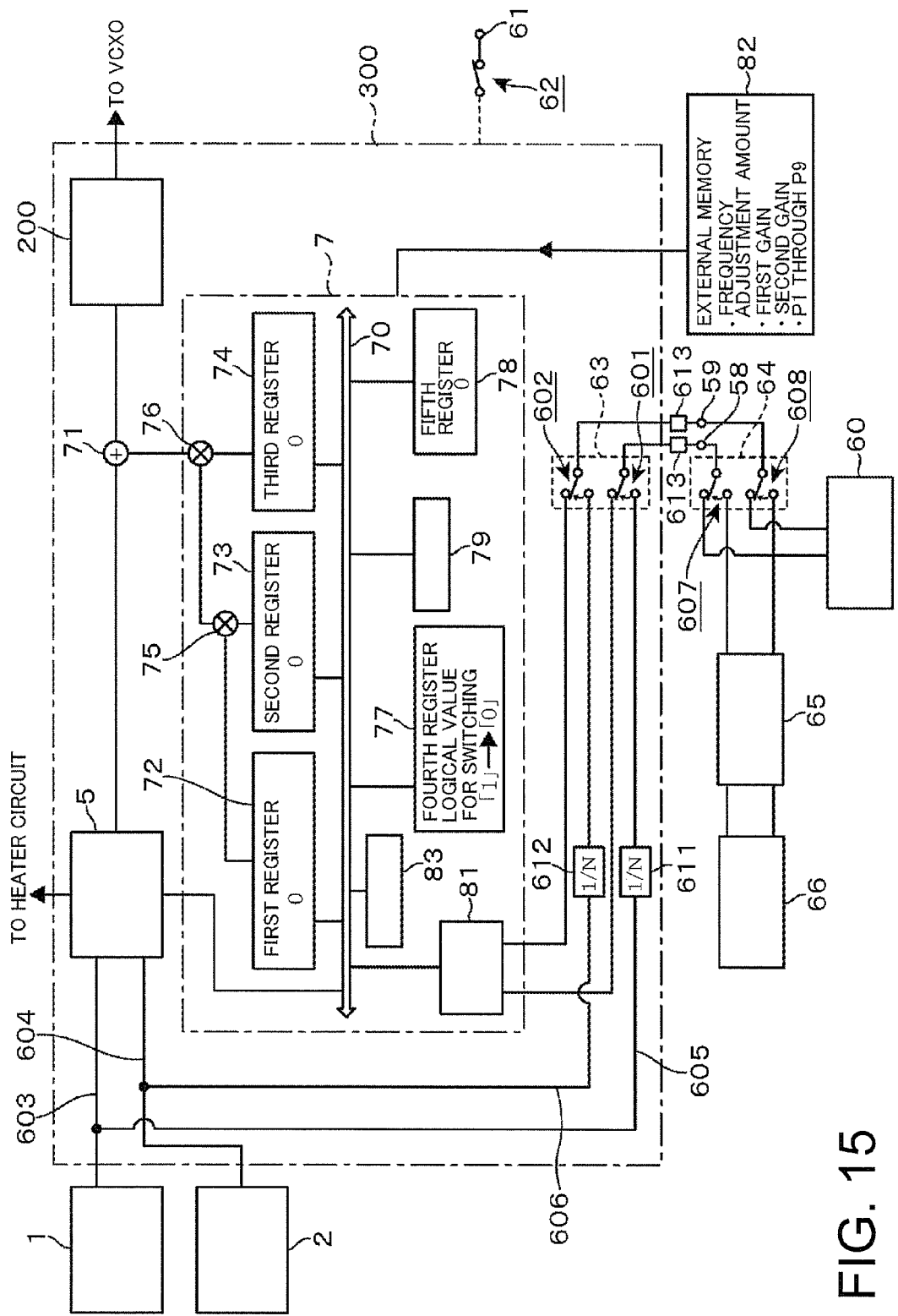
FIG. 15 is an operation diagram illustrating a switching operation.
Figure 16:
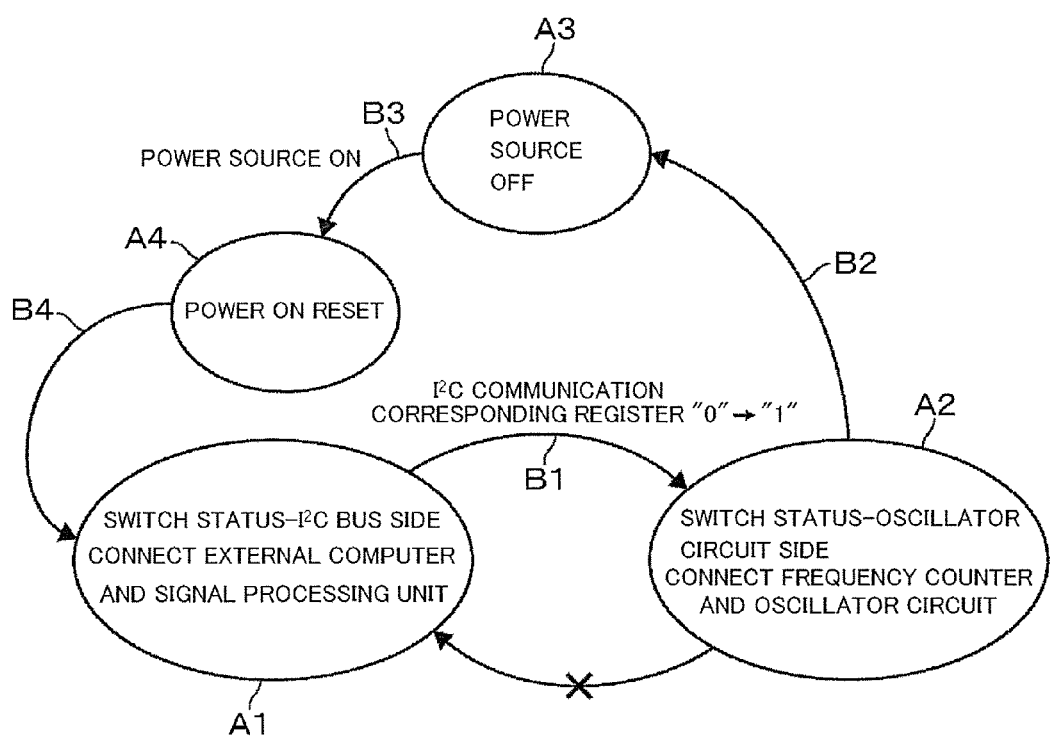
FIG. 16 is an operation diagram illustrating a switching operation.

The following describes a procedure of switching operation between the normal operation mode and the frequency measurement mode using each switch of the oscillator 1A with reference to FIG. 11 and FIGS. 13 through 15, which illustrating switched states. In this example, the switching operation is performed for setting the coefficients P1 through P9, which are used in the above-described formula (1), during the fabrication of the oscillator 1A. FIG. 16 schematically illustrates the switching operation of the modes. The procedure is also described with reference to the FIG. 16 accordingly.

FIG. 11 illustrates the oscillator 1A operating in the normal operation mode. The oscillator 1A is in a state corresponding to A1 in FIG. 16. In the state of FIG. 11, the first connecting terminal 58 and the second connecting terminal 59 are connected to the external computer 60 via the I²C bus by each of the switches 607 and 608 of the connection switching tool 64. The fourth register 77 stores "0" as a logical value for switching operation. Accordingly, the switches 601 and 602 of the connection switching unit 63 connect the first connecting terminal 58 and the second connecting terminal 59 to the interface circuit 81, which allows to access the microcontroller 7 from the external computer 60. The first through third registers 72 through 74 store the frequency adjustment amount, the first gain, and the second gain, which are read out from the external memory 82. Similar to this, the fifth register 78 stores various unique information, which is read out from the external memory 82. Note that, regarding the coefficients P1 through P9, information unique to the apparatus has not yet been determined, therefore, for example, predetermined standard values have been set as the coefficients P1 through P9.

Figure 13:
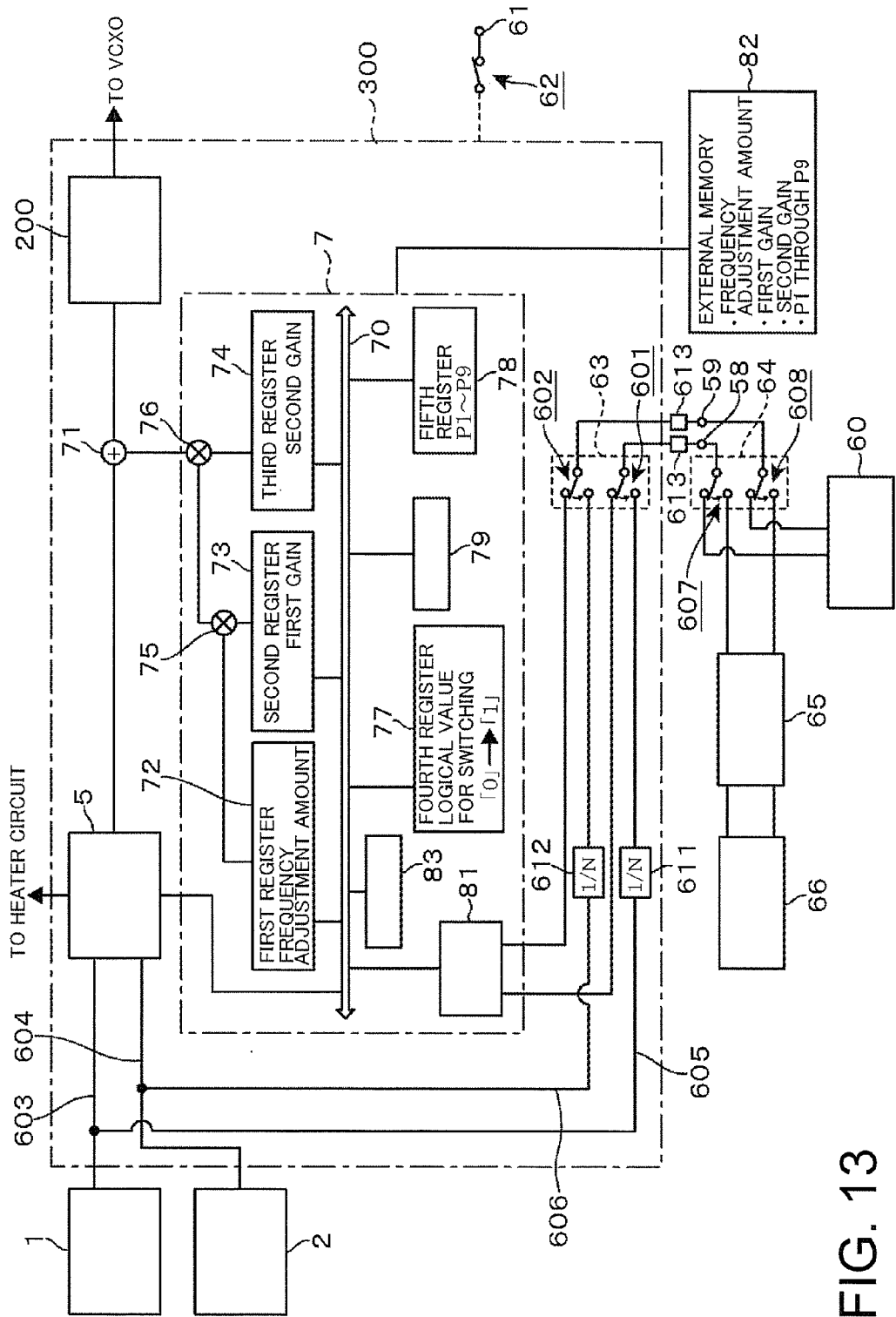
FIG. 13 is an operation diagram illustrating a switching operation.

For example, this oscillator 1A is stored in an oven where internal temperature is changeable. Then as shown in FIG. 13, a user access the fourth register 77 from the external computer 60, and writes "1" as a logical value for switching operation (B1 in FIG. 16). This switches the switches 601 and 602 of the connection switching unit 63, which disconnects the first connecting terminal 58 and the second connecting terminal 59 from the microcontroller 7, then respectively connects these connecting terminals 58 and 59 to the signal paths 605 and 606 instead. Such switching operation of the switches 601 and 602 terminates communication between the external computer 60 and the oscillator 1A via the I²C bus. For example, the external computer 60 switches each of the switches 607 and 608 of the connection switching tool 64 after the external computer 60 detects the termination of the communication. Instead of detecting the termination of communication like this, the external computer 60 may switch the switches 607 and 608 after predetermined time has elapsed since the logical value "1" was written. Thus, switching operation of each of the switches 607 and 608 connects the first connecting terminal 58 and the second connecting terminal 59 to the frequency counter 66 instead of connecting to the external computer 60. Then, the oscillator 1A operates in the frequency measurement mode (A2 in FIG. 16).

As shown in FIG. 14, the output f1 of first oscillator circuit 1 is frequency-divided by the frequency divider 611 connected to the signal path 605. Then, the frequency-divided signal is output to the frequency counter 66 via the first connecting terminal 58 and the buffer circuit 65, then the frequency counter 66 measures the frequency f1/N of the frequency-divided signal. Also, the output f2 of the second oscillator circuit 2 is frequency-divides by the frequency divider 612 connected to the signal path 605. Then, the frequency-divided signal is output to the frequency counter 66 via the second connecting terminal 59 and the buffer circuit 65, then the frequency counter 66 measures the frequency f2/N of the frequency-divided signal. A user calculates the frequencies of f1 and f2 by multiplying the measured values by N, which is already-known. Then, similarly to this, the frequencies of f1 and f2 are measured at each temperature with sequentially changing temperatures in the above-described oven and the relation between (OSC2−OSC1) and temperature is obtained using the frequencies of f1 and f2 measured at each temperature. To output the above-described nominal frequency from the measurement data, a frequency correction curve, which indicates the relation between the temperature and −OSC1 is obtained for canceling the frequency variation amount relative to temperature. Then, the coefficients for the coefficients P1 through P9 of the ninth-order polynomial approximation formula is calculated using the least squares method.

After calculation of P1 to P9, for example, a user operates the power source switch 62 of the apparatus to turn off the power source of the oscillator 1A (A3 and B2 in FIG. 16), and removes the oscillator 1A from the oven. Then, a user operates, for example, the external computer 60, and switches the switches 607 and 608 of the connection switching tool 64 such that the first connecting terminal 58 and the second connecting terminal 59 are connected to the external computer 60 instead of the frequency counter 66. In addition, the user rewrites the coefficients P1 through P9 that are standard values stored in the external memory 82 to the calculated coefficients P1 through P9 using the external computer 60 through a signal path (not shown), which connects the external computer 60 and the external memory 82.

After that, the user operates the power source switch 62 of the apparatus to turn on the power source of the oscillator 1A (B3 in FIG. 16), which causes the power-on reset circuit 79 to initialize data to "0", the data being stored in the first through fifth registers of the microcontroller 7. As described above, each piece of unique information such as data corresponding to the frequency adjustment amount, the first gain, the second gain, the coefficients P1 through P9, and the nominal frequency is read out from the external memory 82 and written to the corresponding respective registers. As shown in FIG. 15, changing a logical value for switching operation, which is stored in the fourth register 77, to "0" switches the switches 601 and 602 of the connection switching unit 63 to disconnect the first connecting terminal 58 and the second connecting terminal 59 from the respective signal paths 605 and 606, and respectively connect the first and second connecting terminals 58 and 59 to the interface circuit 81. Thus, the oscillator 1A returns to a state of A1 in FIG. 16, that is, the normal operation mode. An oscillation output is obtained based on the changed coefficients P1 to P9. This allows the frequency adjustment by changing the frequency adjustment amount in the first register 72 from the external computer 60 (A4 and B4 in FIG. 16).

Note that, as shown in FIG. 16, since the external computer 60 and the microcontroller 7 are disconnected during the frequency measurement mode, it is required to transit from the frequency measurement mode to the normal operation mode after turning off the power source of the oscillator 1A, as described above. Although not shown, when the power source is turned off in the normal operation mode, the switches 601 and 602 keep the connection of the connecting terminals 58 and 59 to the interface circuit 81 since the logical value in the fourth register 77 remains "0" at the time points before and after the power source is turned on again.

At the shipping of the oscillator 1A, which has been fabricated with setting the coefficients P1 through P9 as described above, the buffer circuit 65, the frequency counter 66, and the connection switching tool 64 are not used and therefore removed from the oscillator 1A. When the oscillator 1A operates normally, for example, the external computer 60 is directly connected to the connecting terminals 58 and 59 without the connection switching tool 64. For setting the coefficients P1 through P9 again, the buffer circuit 65, the frequency counter 66, and the connection switching tool 64 are connected to the oscillator 1A as described above. It is possible to switch the connection destination of the connecting terminals 58 and 59 in accordance with the operation modes. For example, the connecting terminals 58 and 59 are connected to the frequency counter 66 in the frequency measurement mode, while the connecting terminals 58 and 59 are connected to the external computer 60 in the normal operation mode. That is, the modes may be switched without the connection switching tool 64.

The power source switch 62 of the apparatus may be connected to the external computer 60 without the connecting terminals 58 and 59, and may be switched on and off from the external computer 60. Each switch of the connection switching tool 64 may be switched manually by a user instead of switching from the external computer 60.

With the oscillator 1A, the connection switching unit 63 alternately switches between: a state where the connecting terminals 58 and 59 are connected to the microcontroller 7 for access of the external computer 60 to each register in the microcontroller 7; and a state where the first and second oscillator circuits 1 and 2 are respectively connected to the connecting terminals 58 and 59 to extract signals f1/N and f2/N, which correspond to the output signals f1 and f2 of the oscillator circuits 1 and 2 from the connecting terminals 58 and 59. Then, resetting condition by turning on and off the power source to initialize the fourth register 77 of the microcontroller 7 causes the oscillator 1A to return to the initial state where the connecting terminals 58 and 59 are connected to the microcontroller 7. The oscillator 1A can detect oscillation signals f1 and f2 with the above-described configuration, and can calculate parameters, based on the detected oscillation signals f1 and f2, for reducing variation due to the temperature characteristics of the oscillation output f1, which allows to increase oscillation accuracy of the oscillator 1A. In addition, it is not required to provide a dedicated terminal for extracting the signals corresponding to output signals f1 and f2 for measuring the signals f1 and f2. Accordingly, this allows to simplify a configuration of an oscillator and reduces production cost of the oscillator.

Figure 17:
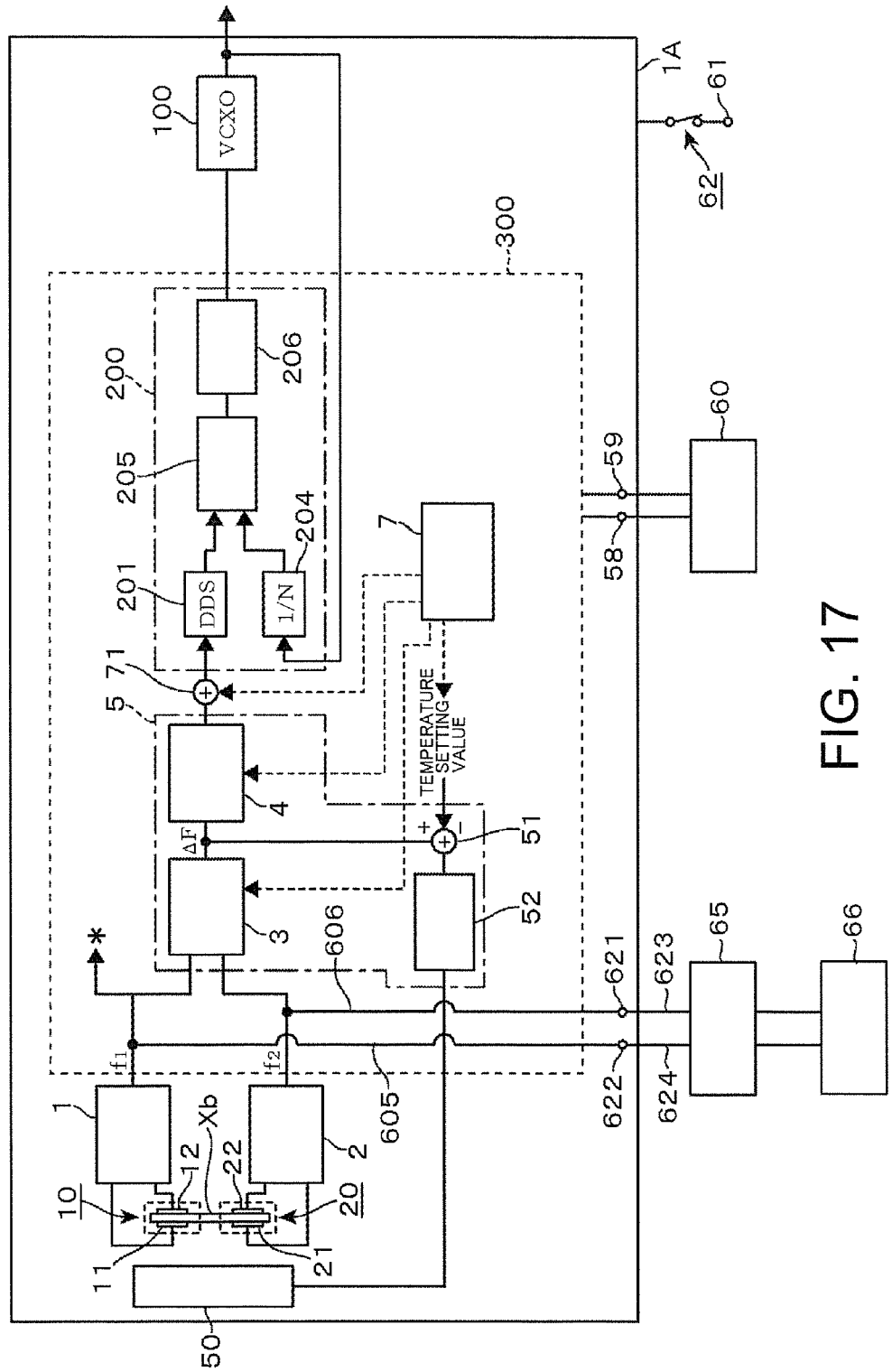
FIG. 17 is a block diagram illustrating the oscillator according to a comparative example.
Figure 18:
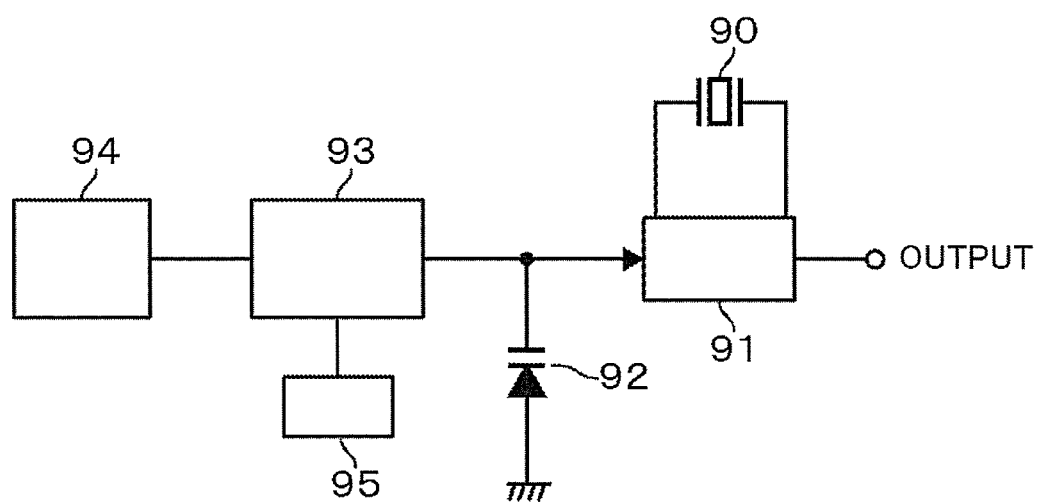
FIG. 18 is a circuit diagram of a conventional oscillator.

FIG. 17 illustrates another oscillator as a comparative example. The oscillator of the comparative example is difference from the oscillator 1A at the point where terminals 621 and 622, which are different from the connecting terminals 58 and 59, are provided, the terminals 621 and 622 respectively being connected to signal paths 605 and 606. The terminals 621 and 622 are connected to the buffer circuit 65 by jumper wires 623 and 624, which are conductive paths, then signals having frequencies f1 and f2 are extracted by the frequency counter 66. However, as described above, providing the terminals 621 and 622 and the jumper wires 623 and 624 results in a complicated configuration of the oscillator and increases the number of fabrication processes. In addition, the jumper wires 623 and 624 are connected by soldering by a worker, which makes it difficult to increase the reliability of fabrication accuracy of the apparatus. Moreover, heat transmits to the jumper wires 623 and 624 before and after measurement of the frequencies f1 and f2, which may change the values of f1 and f2. The above-described oscillator 1A can prevent such faults.

Incidentally, the logical value for switching operation corresponding to the initial state of the fourth register 77 is not limited to "0" when the power source is turned on. The technical scope of the present disclosure also includes the following case. For example, after the power source of electronic equipment is turned on, turning on the operation switch causes an internal device to write the logical value "1" to the fourth register 77 constituting a logical value storage region, then this logical value is used as a logical value for operating the oscillator in the normal operation mode.

While in the above-described description, the setting of the coefficients P1 through P9 using the correction value operator 4 is described, another piece of unique information may be also rewritten. For example, the following case is effective. Similarly to the case of setting the coefficients P1 through P9, temperature change of signals f1 and f2 is measures with changing temperature in the oven. Then, circuit constants of the heater circuit 50 and the heater control circuit 52 may be set based on this measurement result, such that an output of the heater circuit 50 is appropriate for each temperature. That is, the oscillator 1A may have a configuration that controls only one of a correction value operated by the correction value operator 4 or ambient temperature adjusted at the heater circuit 50 to obtain the oscillation frequency f1, which is output to the control circuit unit 200. In addition, a Random Access Memory (RAM) may be used instead of the respective registers 72 through 74, 77, and 78, which are volatile memories of the microcontroller 7, constituting storage unit.

The reset circuit may have any configuration as long as the reset circuit can reset the fourth register 77 separately from the external computer 60. For example, the oscillator 1A may include a manual switch connected to the microcontroller 7, and may operate the manual switch to reset the logical value in the fourth register 77 without turning on and off the power source. In addition, when the manual switch is provided, a switch of the connection switching unit may be switched without using the logical value. Incidentally, a description is given assuming that the external computer 60 is connected to the connecting terminals 58 and 59 during the normal operation. However, the external computer 60 may be disconnected from the connecting terminals 58 and 59 after setting a value of each register. That is, the external computer 60 does not have to be connected during the operation and the external computer 60 may be connected to the connecting terminals 58 and 59 again when each piece of unique information in the register or the external memory 82 needs to be changed.

In the above-described example, the oscillation signals f1 and f2 are frequency-divided by the frequency dividers 611 and 612, and the frequency-divided signals are extracted from the connecting terminals 58 and 59, however the oscillation signals is not necessarily frequency-divided, as long as signals, which have frequencies smaller than f1 and f2, and can be transmitted through the I²C bus, are extracted from the connecting terminals 58 and 59. For example, the oscillator 1A may include a mixer and a filter respectively connected to the signal paths 605 and 606 instead of the frequency divider. Then, a testing oscillator may be connected to the oscillator 1A, the testing oscillator output signals to the mixer. The output frequency of the testing oscillator is set to M, then the mixer outputs signals having frequencies f1−M and f2−M to the connecting terminals 58 and 59 via the filter. Since the frequency M is set in advance, the f1−M and f2−M can be measured using the frequency counter 66 in order to compute the oscillation frequency f1 and f2. However, connecting the testing oscillator may make the oscillator 1A large, accordingly it is preferred to connect the frequency divider as described above.

What is claimed is:

1. An oscillator that uses a differential signal corresponding to a difference between an oscillation output f1 of a first oscillator circuit and an oscillation output f2 of a second oscillator circuit as a temperature detection value, and outputs a control signal for reducing an influence caused by a temperature characteristic of the oscillation output f1 based on the differential signal, the oscillator comprising:
   a storage unit that stores a parameter for outputting the control signal;
   a signal processing unit connected to a first signal path and a second signal path for respectively extracting the signals f1 and f2, the signal processing unit being configured to obtain the differential signal from the extracted signals f1 and f2, and output the control signal based on the differential signal and the parameter;
   a first connecting terminal and a second connecting terminal for connecting to an external computer;
   a frequency reduction unit connected to the first oscillator circuit and the second oscillator circuit, the frequency reduction unit being configured to output signals having frequencies that respectively correspond to the frequencies of the signals f1 and f2 and are lower than the frequencies of the signals f1 and f2; and
   a switching unit configured to alternately switch between a first state and a second state, the first state being a state where the first connecting terminal and the second connecting terminal are connected to the storage unit for access of the external computer to the storage unit, and the second state being a state where the first connecting terminal and the second connecting terminal are respectively connected to the first signal path and the second signal path via the frequency reduction unit such that the output signals from the frequency reduction unit are extracted to an external frequency measuring unit.

2. The oscillator according to claim 1, wherein the frequency reduction unit is a frequency divider, and the output signals having frequencies respectively corresponding to the frequencies of the signals f1 and f2 and are lower than the frequencies of the signals f1 and f2 are respectively obtained by frequency-dividing the signals f1 and f2.

3. The oscillator according to claim 1, wherein the switching unit switches between the first state and the second state based on a logical value stored in a storage region for switching of connection state provided in the storage unit,
   wherein the storage region for switching stores a logical value selected from a first logical value and a second logical value, the first logical value being a value for driving the switching unit to the first state, the second logical value being a value for driving the switching unit to the second state, and
   the oscillator further comprises a reset unit configured to reset the logical value in the storage region for switching to the first logical value, the reset unit being provided independently of the external computer.

4. The oscillator according to claim 3, wherein the reset unit resets the logical value in the storage region for switching to the first logical value, when a power source of the oscillator is turned on.

5. The oscillator according to claim 1, wherein a control signal for reducing an influence caused by a temperature characteristic of the signal f1 is a signal corresponding to a frequency correction value relative to the signal f1 at a reference temperature, the control signal being based on a relation between a variation amount from a value of the signal f1 at the reference temperature of the signal f1 and a signal corresponding to a difference between the signals f1 and f2.

6. The oscillator according to claim 5, wherein the parameters include a parameter for setting a relation between the variation amount from the value of the signal f1 at the reference temperature of the signal f1, and the signal corresponding to the difference between the signals f1 and f2.

7. The oscillator according to claim 5, wherein the storage unit stores a parameter for adjusting an output frequency from the oscillator, separately from the parameter for setting a relation between the variation amount from the value of the signal f1 at the reference temperature of the signal f1 and the signal corresponding to the difference between the signals f1 and f2.

8. The oscillator according to claim 1, further comprising:
   a heat regulating unit configured to maintain a constant temperature of a first crystal unit and a second crystal unit, the first crystal unit and the second crystal unit being respectively connected to the first oscillator circuit and the second oscillator circuit,
   wherein a control signal for reducing an influence caused by a temperature characteristic of the signal f1 is a signal for controlling an amount of heat generated by the heat regulating unit.

9. The oscillator according to claim 1, wherein the frequency reduction unit outputs a signal having a frequency equal to or less than 400 kHz.

10. The oscillator according to claim 1, wherein the first connecting terminal and the second connecting terminal are connected to the storage unit via an I²C bus in the first state.

* * * * *